United States Patent
Mallet

(10) Patent No.: US 10,310,137 B1
(45) Date of Patent: Jun. 4, 2019

(54) SYSTEMS AND METHODS FOR BUILDING AXES, CO-AXES AND PALEO-GEOGRAPHIC COORDINATES RELATED TO A STRATIFIED GEOLOGICAL VOLUME

(71) Applicants: Paradigm Sciences Ltd., Grand Cayman (KY); Jean-Laurent Mallet, Luxembourg-Beggen (LU)

(72) Inventor: Jean-Laurent Mallet, Luxembourg-Beggen (LU)

(73) Assignee: Emerson Paradigm Holding LLC, Houston, TX (US)

( * ) Notice: Subject to any disclaimer, the term of this patent is extended or adjusted under 35 U.S.C. 154(b) by 0 days.

(21) Appl. No.: 15/205,281

(22) Filed: Jul. 8, 2016

Related U.S. Application Data

(63) Continuation of application No. 13/836,502, filed on Mar. 15, 2013, now Pat. No. 9,418,182, which is a
(Continued)

(51) Int. Cl.
*G01V 1/32* (2006.01)
*G06F 17/16* (2006.01)
(Continued)

(52) U.S. Cl.
CPC .......... *G01V 99/005* (2013.01); *G01V 1/325* (2013.01); *G06F 17/16* (2013.01);
(Continued)

(58) Field of Classification Search
None
See application file for complete search history.

(56) References Cited

U.S. PATENT DOCUMENTS

| | | | | |
|---|---|---|---|---|
| 4,821,164 A | * | 4/1989 | Swanson | G01V 1/282 2/919 |
| 8,010,294 B2 | * | 8/2011 | Dorn | G01V 1/30 702/14 |

(Continued)

OTHER PUBLICATIONS

E. Labrunye, C. Winkler, C. borgese, J. Mallet, "New 3D flattened space for seismic interpretation" pp. 1132-1136, 2009.*
(Continued)

*Primary Examiner* — Kibrom K Gebresilassie
(74) *Attorney, Agent, or Firm* — Pearl Cohen Zedek Latzer Baratz LLP

(57) ABSTRACT

A method and system for modeling a subsurface structure at a time when the structure was originally formed. A first model having non-planar horizons representing a current subsurface structure may be used to calculate a vector field based on the non-planar geometry of the horizons of the model. The vector field may be non-uniform or uniform. Geographic coordinates of the first model may be transformed to paleo-geographic coordinates of a model representing the subsurface structure in the past, where the non-planar horizons in the first model are transformed to planar horizons in the second model. A set of points describing one or more fractures in the subsurface structure may be used to calculate a tuning parameter to correct a first set of paleo-geographic coordinates. A second set of coordinates representing an improved prediction at a time period when the subsurface structure was originally formed may be generated.

21 Claims, 12 Drawing Sheets

Related U.S. Application Data continuation-in-part of application No. 12/791,352, filed on Jun. 1, 2010, now Pat. No. 8,711,140.

(60) Provisional application No. 61/182,813, filed on Jun. 1, 2009.

(51) Int. Cl.
  *G01V 99/00* (2009.01)
  *G06T 17/05* (2011.01)

(52) U.S. Cl.
  CPC .... *G01V 2210/64* (2013.01); *G01V 2210/661* (2013.01); *G01V 2210/74* (2013.01); *G06T 17/05* (2013.01)

(56) References Cited

U.S. PATENT DOCUMENTS

| | | | | |
|---|---|---|---|---|
| 8,711,140 | B1* | 4/2014 | Mallet | G01V 99/005 345/419 |
| 8,743,115 | B1* | 6/2014 | Mallet | G01V 1/302 345/424 |
| 9,524,590 | B1* | 12/2016 | Mallet | G01V 99/005 |
| 2008/0243452 | A1* | 10/2008 | Bowers | G06F 19/701 703/2 |
| 2009/0070079 | A1* | 3/2009 | Harada | G06F 16/283 703/2 |
| 2009/0119082 | A1* | 5/2009 | Fitzpatrick | E21B 49/00 703/10 |
| 2009/0204377 | A1* | 8/2009 | Van Wagoner | G01V 1/282 703/9 |
| 2010/0245347 | A1* | 9/2010 | Dorn | G01V 1/30 345/419 |
| 2010/0250210 | A1* | 9/2010 | Dorn | G01V 1/30 703/2 |
| 2011/0115787 | A1* | 5/2011 | Kadlec | G01V 1/345 345/419 |
| 2011/0264430 | A1* | 10/2011 | Tapscott | G01V 99/00 703/10 |
| 2013/0204598 | A1* | 8/2013 | Mallet | G06F 17/5009 703/6 |
| 2013/0262052 | A1* | 10/2013 | Mallet | G01V 1/302 703/2 |
| 2017/0184760 | A1* | 6/2017 | Li | G01V 99/005 |
| 2018/0067229 | A1* | 3/2018 | Li | G01V 1/282 |

OTHER PUBLICATIONS

J. Mallet, "Space-Time Mathematical Framework for Sedimentary Geology" pp. 1-32, 2004.*

* cited by examiner

SYSTEMS AND METHODS FOR BUILDING AXES, CO-AXES AND PALEO-GEOGRAPHIC COORDINATES RELATED TO A STRATIFIED GEOLOGICAL VOLUME

CROSS-REFERENCE TO RELATED APPLICATIONS

This application is a continuation of U.S. patent application Ser. No. 13/836,502, Now U.S. Pat. No. 9,418,182, filed Mar. 15, 2013, which is a continuation-in-part of U.S. patent application Ser. No. 12/791,352, filed Jun. 1, 2010, issued on Apr. 29, 2014 as U.S. Pat. No. 8,711,140, which in turn claims the benefit of prior U.S. Provisional Application Ser. No. 61/182,813, filed Jun. 1, 2009, all of which are incorporated by reference herein in their entirety.

FIELD OF THE INVENTION

The invention pertains to the general field of modeling stratified terrains in the subsurface.

More precisely, new techniques are proposed to determine structural directions in the subsurface and use these directions to build a system of paleo-geographic coordinates, e.g. (u,v) at any location in a geological domain. The paleo-geographic coordinates (u,v) may be used to model the stratified terrains at the geological-time at which they were originally deposited within the Earth.

BACKGROUND OF THE INVENTION

Erosion and tectonic activity through geological-time transform an initially uniform stratified terrain composed of a continuous stack of level surfaces to a terrain fractured by faults forming discontinuities across the originally continuous horizons. Accordingly, to model the original time of deposition from data collected from the current subsurface structures (e.g., to "reverse time"), the model may simulate a reversal of such erosion and tectonic activity.

However, to generate models at the original time of deposition, current mechanisms use extensive simplifications that often violate for example principles of entropy and minimal energy deformations, thereby rendering the models inaccurate.

Accordingly there is a need in the art to accurately model current structures at a geological-time when they were originally deposited.

SUMMARY OF THE INVENTION

Embodiments of the invention provide a system and method for modeling stratified terrains of a geological subsurface at the time of geological deposition, e.g., including geological horizons and faults.

A three dimensional (3D) model of the subsurface at the time of geological deposition may be represented by for example functions t(x,y,z), u(x,y,z) and v(x,y,z) such that, at any location (x,y,z) within the 3D model:
- t(x,y,z) represents the geological-time of original deposition of a particle of sediment corresponding to a current modeled location (x,y,z); and
- u(x,y,z) and v(x,y,z) represent the paleo-geographic coordinates at the geological-time of deposition t(x,y,z) of a modeled particle of sediment corresponding to a current modeled location (x,y,z).

In an embodiment of the invention, a computing system or processor may be configured to model a subsurface structure at a time period when the structure was originally formed. A memory or other device may store or be configured to store a first model having a plurality of non-planar horizons representing a current state of the subsurface structure. One or more processors may compute a non-uniform vector field based on the non-planar geometry of the horizons of the first model. Using the vector field, the processor may transform geographic coordinates of the first model to paleo-geographic coordinates of a second model representing a predicted, calculated or possible state of the subsurface structure at a time period when the subsurface structure was originally formed, where the non-planar horizons in the first model are transformed to planar horizons in the second model. A display may display the first model.

In an embodiment of the invention, a computing system or processor(s) may determine a global structural axis based on the geometry of the first model. The processor may compute two vector fields. The first vector field and the second vector field may be computed based on the geometry of both the horizons in the first model and the global structural axis. In an embodiment of the invention, a computing system or processor may automatically compute the global structural axis associated with the first model using the global geometry of horizons of the first model. The processor may accept from a user a selection of the global structural axis. The processor may generate the first vector field and the second vector field to include vectors based on the local geometry of the horizons of the first model. The processor may generate each of the paleo-geographic coordinates of the second model as a function of the first vector field and the second vector field. The processor may generate each of the paleo-geographic coordinates of the second model to be a least squares solution of a plurality of linear and independent equations based on the vector field. The processor may generate the paleo-geographic coordinates of the second model to flatten non-planar horizons in the first model. The processor may generate the first model using one or more of seismic records and well data collected by probing the subsurface structure.

In an embodiment of the invention, a computing system or processor(s) may edit models of a geological structure. The processor may compute a transformation between a current model having geographic coordinates representing an observed geological structure and a depositional model having paleo-geographic coordinates representing a calculated, predicted or possible state of the geological structure at a time period when the structure was originally formed. The processor may receive an identification of a gap or an overlap in one of a plurality of planar horizons in the depositional model. The processor may receive identified points on the planar horizon of the depositional model having the identified gap or overlap, where the identified points are erroneously transformed from the corresponding points of the current model. The processor may re-compute the transformation between the current and depositional models so that points of the current model, which were erroneously transformed to the identified points, are transformed to a planar horizon of the depositional model having no gaps and no overlaps. A display may display the current model. The processor may receive a segment or other structure drawn or otherwise input by a user and may identify the gap or overlap intersected thereby. The transformation may define each of the paleo-geographic coordinates of the depositional model to be least squares solutions to a plurality of linear and independent equations based on a vector field of the current model.

In an embodiment of the invention, a computing system or processor(s) may generate a depositional model representing the calculated, predicted or possible past geometry of a subsurface structure in a current model using a global axis and local axis and local co-axis of the structure in the current model. The processor may generate a global axis A of the subsurface structure in a geological domain. At each point (e.g., x,y,z) in the subsurface structure, the processor may compute a vector field of local axis e.g. a(x,y,z) and local co-axis e.g. b(x,y,z) vectors of the subsurface structure using the global axis A and a field of normal vectors orthogonal to horizons of the subsurface structure in the geological domain. At each point (x,y,z) in the subsurface structure, the processor may generate paleo-geographic coordinates u(x,y,z) and v(x,y,z) of the depositional model using the local axis a(x,y,z) and co-axis b(x,y,z) vectors. The paleo-geographic functions u(x,y,z) and v(x,y,z) may map or transform any point (x,y,z) of the current model to a point (u(x,y,z), v(x,y,z), t(x,y,z)) representing a past location of the point in the depositional model. The processor may compute the global axis A of the subsurface structure to be for example an eigen vector associated with the smallest eigen value of a matrix [m] generated using the field of normal vectors orthogonal to the horizons. The processor may receive user input selecting the global axis A. The processor may generate the paleo-geographic coordinates u(x,y,z) and v(x,y,z) assuming that deformation of the subsurface structure deformed from the past depositional model to the current model was minimal. The processor may generate the paleo-geographic coordinates u(x,y,z) and v(x,y,z) by modeling the deformation of the subsurface structure from the past depositional model to the current model using infinitely thin modeled layers that slide against each other.

In an embodiment of the invention, a computing system or processor(s) may model a subsurface structure at a time period when the structure was originally formed. A first horizon modeling a current state of the subsurface structure may be generated using for example one or more of seismic records and well data collected by probing the subsurface structure. The geometry of the first horizon may be determined. A second horizon based on the geometry of the first horizon may be generated. The second horizon may model a possible state of the subsurface structure at a time period when the subsurface structure was originally formed. The model of the second horizon may be displayed.

In an embodiment of the invention, a computing system or processor(s) may transform subsurface models modeling a terrain. A first model representing current locations of particles of sediment in the terrain may be generated. A set of equations that are linear and independent from each other may be generated to compute the paleo-geographic coordinates u(x,y,z) and v(x,y,z). The functions u(x,y,z), v(x,y,z) and t(x,y,z) may be used to transform the first model into a second model representing past locations of the particles of sediment at a time when the particles were originally deposited in the Earth. The second model may be displayed.

In an embodiment of the invention, a computing or processor(s) system may use an initial model of a subsurface structure to correct a deformed model of the same subsurface structure. Identification may be received of a gap or an overlap in one of a plurality of planar horizons in the depositional model. Each horizon may be determined to be deposited at a substantially different initial geological time. Identified points may be received in the deformed model that correspond to the identified gap or overlap in the initial model. The constraints associated with identified points may be removed from the deformed model. The deformed model without the identified points may be displayed.

BRIEF DESCRIPTION OF THE DRAWINGS

The principles and operation of the system, apparatus, and method according to embodiments of the present invention may be better understood with reference to the drawings, and the following description, it being understood that these drawings are given for illustrative purposes only and are not meant to be limiting.

Figure 1:
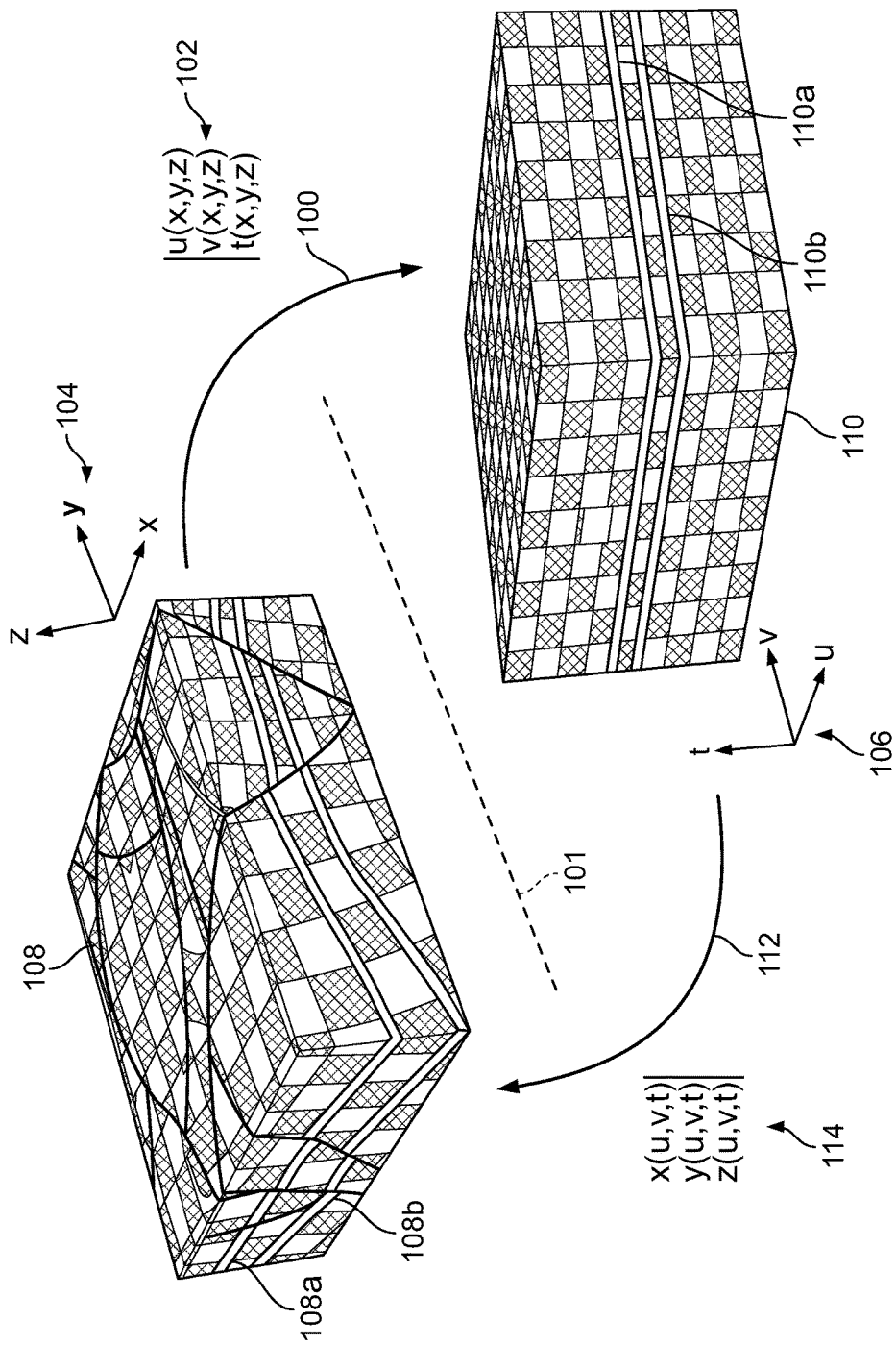
FIG. 1 is a schematic illustration of a uvt-transformation between two 3D spaces.

For simplicity and clarity of illustration, elements shown in the drawings have not necessarily been drawn to scale. For example, the dimensions of some of the elements may be exaggerated relative to other elements for clarity. Further, where considered appropriate, reference numerals may be repeated among the drawings to indicate corresponding or analogous elements throughout the serial views.

DETAILED DESCRIPTION

For the sake of clarity and for the purpose of simplifying the presentation of embodiments of the invention, the following preliminary definitions are given, although other definitions may be used:

Geological-Time

A particle of sediment in a geological terrain may be observed at a location in the subsurface. The seismic data for the location may be collected from underground imaging to acquire seismic or well data, for example, by recording acoustic or other waves using transmitters and receivers. The location of the particle may be mathematically represented or modeled, e.g., by a vector, (x,y,z), in a three-dimensional (3D) space, such as the Cartesian coordinate system (of course, when modeling such particles, the position of many particles may be modeled together as for example using a cell). When modeled, a data structure such as a node or cell may represent particles. The time when the particle of sediment was originally deposited may be referred to as the "geological-time" and may be represented or modeled, e.g., as a geological-time function of the current location of the particle, t(x,y,z). When used herein, a "current" location for a particle (or data structure representing one or more particles) or subsurface feature may mean the location of the item in the present day, relative to geological time. The actual geological-time of the deposition of particles may be difficult to determine and may be replaced, e.g., by any arbitrary monotonic increasing function of the actual geological-time. The monotonic function may be referred to as the "pseudo-geological-time". Geological-time and pseudo-geological-time are referred to interchangeably herein.

Horizon, Fault and Unconformity

In stratified layers, horizons, faults and unconformities may be curvilinear (e.g., non-planar) surfaces which may be for example characterized as follows.

A horizon, H(t), may be a surface corresponding to a plurality of particles of sediment which were deposited approximately at substantially the same geological-time, t.

A fault may be a surface of discontinuity of the horizons that may have been induced by a relative displacement of terrains on both sides of such surfaces. In other words, the geological-time (t) of deposition of the sediments is discontinuous across each fault. Faults may cut horizons and may also cut other faults.

An unconformity may be a surface of discontinuity of the horizons that may have been induced by for example an erosion of old terrains replaced by new ones. In other words, similarly to faults, the geological-time (t) of deposition of the sediments is discontinuous across each unconformity. When discussed herein, unconformities are treated as faults: as a consequence, in this patent application, faults may include both real faults and unconformities. Alternately, unconformities may be surfaces bounding a sequence of sedimentary layers and one specific geological-time function may be assigned to each such sequence.

Level Surface

The geological domain may be defined in a 3D space by a given function of geological-time, t(x,y,z). The geological-time function t(x,y,z) may be monotonic, e.g., the gradient of the geological-time never vanishes and the function has no local maximum or minimum values. A level surface, $H(t_0)$, may be the set of points where the geological-time t(x,y,z) is equal to a given numerical value, $t_0$. Therefore, if the geological-time t(x,y,z) represents a pseudo-geological-time of deposition, then the level surface $H(t_0)$ of t(x,y,z) may be a geological horizon.

Various mechanisms are currently used for modeling subsurface geological terrains:

Discrete-Smooth-Interpolation (DSI)

Discrete-Smooth-Interpolation (DSI) is a method for interpolating or approximating values of a function f(x,y,z) at nodes of a given 3D mesh, M, while honoring a given set of constraints. The DSI method allows properties of structures to be modeled by embedding data associated therewith in a (e.g., 3D Euclidean) modeled space. The function f(x,y,z) may be defined by values at the nodes of the mesh, M. The DSI method allows the values of f(x,y,z) to be computed at the nodes of the mesh, M, so that a set of one or more (e.g., linear) constraints are satisfied.

Constraints are typically classified by one of the following types:

1) "Soft" constraints may require the function f(x,y,z) to approximate a constraint. For example, a soft constraint may be that f(x,y,z) takes a given value at a given sampling point, e.g., that is not coincident with a node of the mesh M. Since this constraint is "soft", f(x,y,z) may take a least squares approximation of the given value;

2) "Hard" constraints may require that the function f(x,y,z) exactly honors the constraints. For example, a hard constraint may include inequality constraints; and 3) "Smoothness" constraints may require that the function f(x,y,z) varies as smoothly as possible from one node to its neighbors while honoring the soft and hard constraints.

Examples of DSI constraints may include, but are not limited to, for example:

The Control-Point constraint which may require that, at a given location $(x_0,y_0,z_0)$ the value of $f(x_0,y_0,z_0)$ is equal to a given value $f_0$;

The Control-Gradient constraint specifying that, at a given location $(x_0,y_0,z_0)$ the gradient of $f(x_0,y_0,z_0)$, denoted {grad $f(x_0,y_0,z_0)$}, is equal to a given vector $G_0$;

The Gradient-Direction constraint specifying that, at a given location $(x_0,y_0,z_0)$ the gradient of $f(x_0,y_0,z_0)$, denoted {grad $f(x_0,y_0,z_0)$}, is parallel to a given vector $D_0$; and The Delta constraint specifying that, given two locations $(x_0,y_0,z_0)$ and $(x_1,y_1,z_1)$ in the studied domain, the difference between $f(x_0,y_0,z_0)$ and $f(x_1,y_1,z_1)$ may either be equal to, lesser than, or greater than, a given value D.

GeoChron Model

When a layer of particles was deposited during a certain geological-time period in the past, the layer typically had uniform properties, such as particle density, porosity, etc. However, through time, the layers erode and are disrupted by faults, tectonic motion or other sub-surface movements, which result in uneven and discontinuous layers. As compared to the uniform layers of the past, the discontinuous layers of the present are difficult to model. Accordingly, the "GeoChron" model has recently been developed to operate between two 3D spaces. The 3D spaces or models may be, for example:

A 3D space, G, representing a model of the current subsurface features (e.g., current modeled locations of particles of sediment in the terrain). The modeled location of each particle may be represented by the coordinates (x,y,z), where (x,y) may describe the geographical coordinates of the particle (e.g., latitude and longitude) and (z) may describe the altitude or distance below or above a surface level; and A 3D space, G*, representing modeled locations of particles of sediment at the time when the particles were originally deposited. The modeled location of each particle may be represented by the coordinates (u,v,t) where (t) may be the geological-time of deposition of the particle and (u,v) may be the paleo-geographical coordinates of the particle at geological-time (t).

The GeoChron model defines a transformation between the two 3D spaces G and G*. The transformation may be referred to as a "uvt-transformation". The GeoChron model applies a forward uvt-transformation to transform the current model (a model of the subsurface features current in time) in G-space to the original deposition model in G*-space and applies an inverse uvt-transformation to transform the original deposition model in G*-space to the current model in G-space. Accordingly, the GeoChron model may execute complex computations on the original deposition model in G*-space where geological properties are typically uniform and simple to manipulate relative to the discontinuous current model in G-space. Once the original deposition model is sufficiently accurate, using the "reverse uvt-transformation", the GeoChron model may transform the model back to the current time domain to generate the current model.

Figure 6:
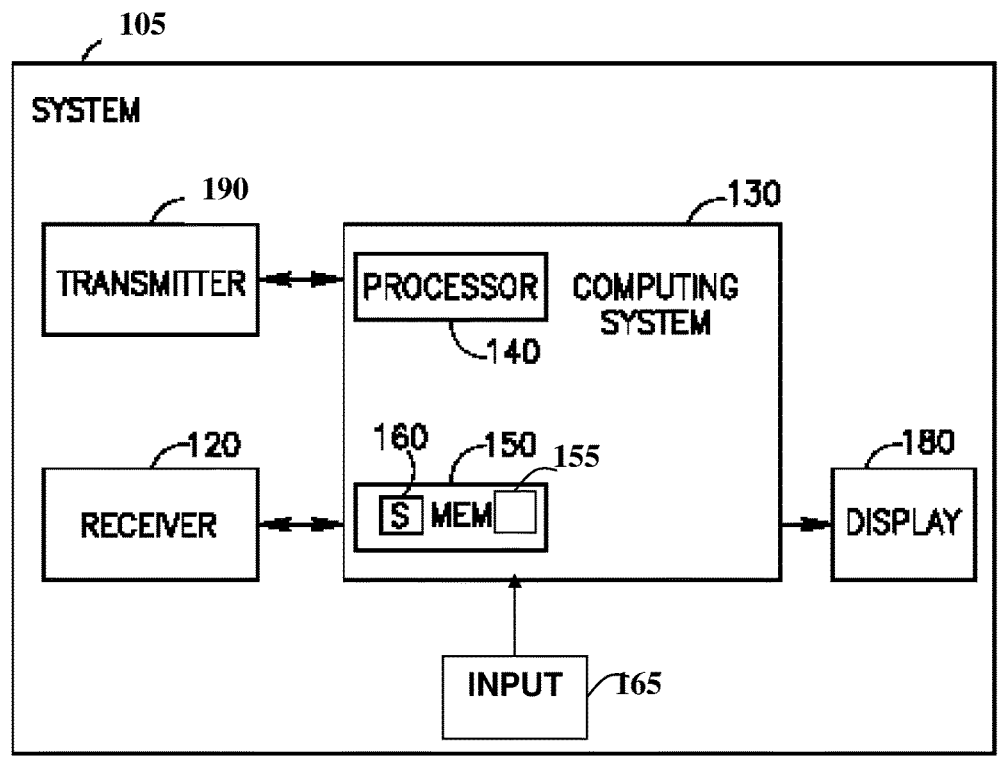
FIG. 6 is a schematic illustration of a system according to an embodiment of the invention.

When used herein, "generating" or "creating" a model or a subsurface feature may include creating data representing the model or feature, the data being stored for example in a computer system such as that shown in FIG. 6.

Reference is made to FIG. 1, which schematically illustrates a uvt-transformation between the two 3D spaces G 104 and G* 106 (separated by dashed line 101).

The "forward" or "direct" uvt-transformation 100 may be defined by functions 102 {u(x,y,z),v(x,y,z),t(x,y,z)}, which transform each point (x,y,z) of the geological G-space 104 to a point {u(x,y,z),v(x,y,z),t(x,y,z)} in the depositional G*-space 106. The forward uvt-transformation 100 may be represented, for example, as follows:

$$(x, y, z) \xrightarrow{UVT} \{u(x, y, z), v(x, y, z), t(x, y, z)\} \quad [1]$$

The forward uvt-transformation 100 transforms each horizon H(t) (e.g., 108a or 108b) of model 108, in the G-space 104, into a level horizontal plane H*(t) (e.g., 110a and 110b, respectively) of model 110 in the G*-space 106. In the G*-space 106, horizons 110a and 110b of model 110 are simply the images of the level surfaces of the function t(x,y,z) representing the geological-time at location (x,y,z) in the G-space. That is, since a horizon models a set of particles of sediment that was uniformly deposited in time, each horizon is constant at the time when the particles modeled thereby were originally deposited (e.g., in G*-space 106). Therefore, each horizon 110a and 110b in G*-space 106 may be planar and uniquely defined by a single time, (t).

Conversely, the "inverse" or "reverse" uvt-transform 112 may be defined by functions 114 {x(u,v,t), y(u,v,t), z(u,v,t)}, which transform each point (u,v,t) of the depositional G*-space 106 to a point {x(u,v,t), y(u,v,t), z(u,v,t)} in the geological G-space 104. The inverse uvt-transformation 112 may be represented, for example, as follows:

$$(u, v, t) \xrightarrow{UVT^{-1}} \{x(u, v, t), y(u, v, t), z(u, v, t)\} \quad [2]$$

In practice, such a reverse transformation is restricted to a part $G^*_0$ of the G*-space called the holostrome and corresponding to the particles of sediment which can actually be observed today in the G-space.

Using the forward uvt-transform 100, e.g., defined in equation (1), and the inverse uvt-transform 112, e.g., defined in equation (2), any geological property may be modeled in one of the two spaces (G-space 104 or G*-space 106) and the result of the property modeled in the one space may be transferred to the other space (G*-space 106 or G-space 104, respectively). In practice, a geological property is typically modeled in the space where modeling the property is the simplest.

Characterization of Paleo-Geographic Coordinates

The paleo-geographic coordinates u(x,y,z) and v(x,y,z) model the location of a particle of sediment observed (or estimated, or simulated) today (e.g., in modern times) at location (x,y,z) in the subsurface when the particle was originally deposited at a certain geological-time, t(x,y,z). The solutions for the paleo-geographic coordinates u(x,y,z) and v(x,y,z) may be determined by solving one or more differential equations of the paleo-geographic coordinates u(x,y,z) and v(x,y,z). Each different form of the differential equation used to determine the paleo-geographic coordinates may be associated with a different type of structural style (e.g., induced by tectonic activity) by which the modeled sediment was formed. Types of structural style may include, for example:

A minimum-deformation type: A deformation where the components of a strain tensor for measuring the deformation of geological structures from depositional time to present day may be approximately zero (or as close to zero as possible). Accordingly, differential equations for determining paleo-geographic coordinates u(x,y,z) and v(x,y,z) that underwent a minimum-deformation of the modeled subsurface may, for example, have the following forms:

$$\|\text{grad } u\| \sim 1 \quad [3a]$$

$$\|\text{grad } v\| \sim 1 \quad [3b]$$

$$\text{grad } u \cdot \text{grad } v \sim 0 \quad [3c]$$

$$\text{grad } t \cdot \text{grad } u \sim 0 \quad [3d]$$

$$\text{grad } t \cdot \text{grad } v \sim 0 \quad [3e]$$

where (grad f) represents the gradient of a function f(x,y,z) and the symbol "•" represents the vector dot product operator.

The flexural-slip type: A deformation in which structures are approximated by infinitely thin modeled layers that slide against each other without friction during the tectonic episodes. Differential equations for determining the paleo-geographic coordinates u(x,y,z) and v(x,y,z) that underwent flexural-slip deformations may, for example, have the following forms:

$$\|\text{grad} H\, u\| \sim 1 \quad [4a]$$

$$\|\text{grad} H\, v\| \sim 1 \quad [4b]$$

$$\text{grad} H\, u \cdot \text{grad} H\, v \sim 0 \quad [4c]$$

where the symbol "•" represents the vector dot product operator and where (gradH u) and (gradH v) represent the projection of the gradient of the paleo-geographic coordinates u(x,y,z) and v(x,y,z), respectively, onto a geological horizon at the current location (x,y,z).

According to principles of entropy, the movement of geological structures from an initial location u(x,y,z) and v(x,y,z), when they were originally deposited at a geological-time t(x,y,z), to a current location (x,y,z), e.g., by forces of tectonic activity, has a greater probability of occurring when the amount of energy used for the deformation is minimized. To minimize the amount of energy used for the geological structures to deform, components of the strain tensor measuring the deformation of the geological structures may be minimized. Minimizing the components of the strain tensor measuring the deformation of the geological structures may be represented mathematically, for example, by equations [3a] to [3e] or [4a] to [4c]. Therefore, a more entropic and accurate model of deposition may be generated, the closer ||grad u|| and ||grad v|| or ||gradH u|| and ||gradH u|| approximate 1. However, achieving such a close approximation of equations [3a] and [3b] or [4a] and [4b] is extremely difficult, for example, especially when horizon surfaces are curved or irregularly shaped. Accordingly there is a need in the art to achieve a mechanism for modeling current structures at a geological-time when they were originally deposited, where the deformation of the current structure from its original state of deposition occurred with a minimum amount of energy.

GeoChron Model for Faults

Model 108 (of FIG. 1) defined by the functions u(x,y,z), v(x,y,z) and t(x,y,z) may be piecewise continuous. Typically, the only discontinuities of these functions may represent subsurface fractures induced by fault surfaces. At the geological-time of deposition of the particles of sediment, before faulting induced by tectonic events occurred, the subsurface layers were continuously formed and may therefore be represented in model 110 by horizontal planes.

Figure 2:
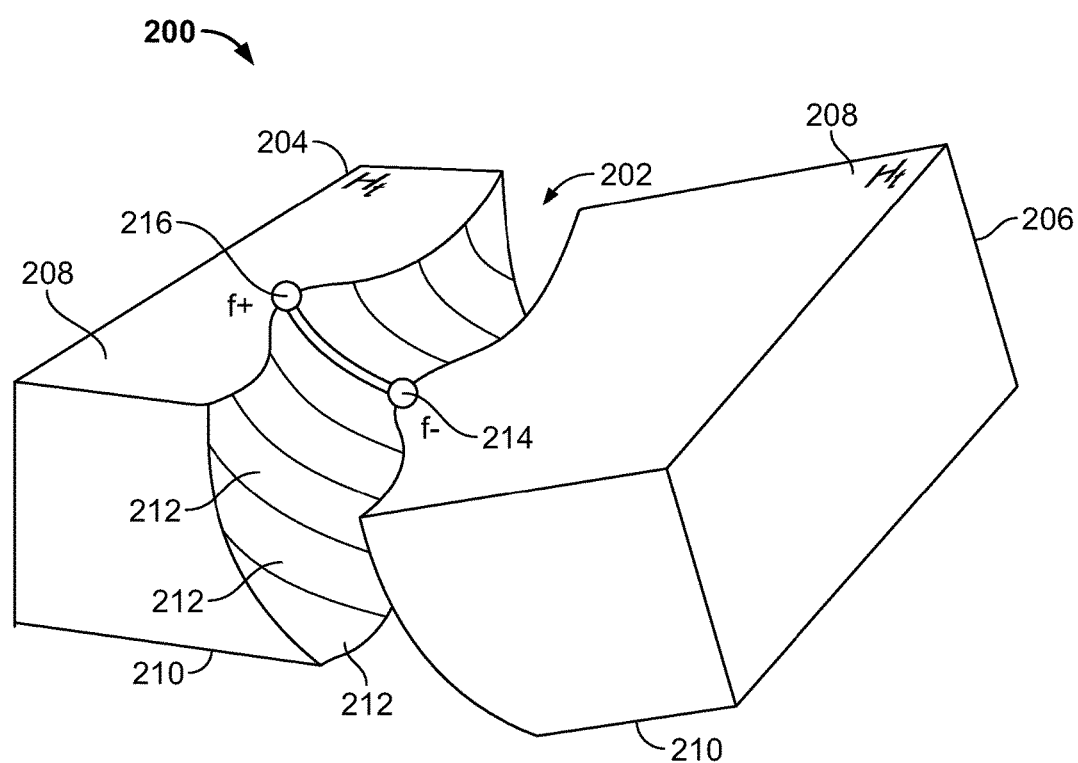
FIG. 2 is a schematic illustration of a model of a subsurface region fractured by a fault surface.

Reference is made to FIG. 2, which schematically illustrates a model of a subsurface region 200 fractured by a fault surface 202. Subsurface region 200 includes a first fault block 204 and a second fault block 206 located along opposite sides of fault surface 202. Fault blocks 204 and 206 are located between adjacent horizons 208 and 210. Each portion of horizon 208 located on top of separate fault blocks 204 and 206 corresponds to a subsurface region that was originally deposited at substantially the same geological-time, and that has since moved relative to the other portion in a direction along fault surface 202. A "throw-vector" may be a vector, $T(x_f, y_f, z_f)$, which has a direction tangent to fault surface 202 corresponding to the displacement of fault blocks 204 and 206 relative to each other.

For each horizon 208 and fault surface 202, a set of pairs of points $P_{CF} = \{(f_{1-}, f_{1+}), (f_{2-}, f_{2+}), \ldots, (f_{n-}, f_{n+})\}$ 214 and 216 may be generated, such that each point is located at an intersection of fault surface 202 and horizons 208 and such that, for each pair of points $(f_-, f_+)$ 214 and 216:
a) the points $(f_-)$ and $(f_+)$ 214 and 216 are located on a same fault stria 212 tangent to the direction of the throw;
b) The points $(f_-)$ and $(f_+)$ 214 and 216 were collocated on horizon 208 at the original geological-time of deposition.

To account for the continuity of the paleo-geographic coordinate functions u(x,y,z) and v(x,y,z) across fault surface 202, functions u(x,y,z) and v(x,y,z) may be defined for each pair of points $(f_-, f_+)$ 214 and 216 in the set $P_{CF}$, for example, as follows:

$$u(x_-, y_-, z_-) - u(x_+, y_+, z_+) = 0 \quad [5a]$$

$$v(x_-, y_-, z_-) - v(x_+, y_+, z_+) = 0 \quad [5b]$$

where $(x_-, y_-, z_-)$ and $(x_+, y_+, z_+)$ are the coordinate values of points $f_-$ and $f_+$ 214 and 216, respectively.

According to equations [5a] and [5b], the values of u(x,y,z) and v(x,y,z) are equal at points 214 and 216 on opposite sides of fault surface 202, which were collocated at the geological-time of deposition t(x,y,z).

Furthermore, the gradients (grad u) and (grad v) of the functions u(x,y,z) and v(x,y,z), respectively, were also continuous at the geological-time of deposition. Accordingly, the following description is provided:

Nf− and Nf+ are normal unit vectors of fault surface 202 at points f− and f+ 214 and 216, respectively. Nf− and Nf+ have a direction oriented towards the interior or center of each of fault blocks 206 and 204, respectively.

Nh− and Nh+ are normal unit vectors of horizon 208 of points f− and f+ 214 and 216, respectively. Nh− and Nh+ have a direction oriented towards younger horizons deposited at a more recent geological-time (e.g., in the positive t direction in uvt-space).

N− and N+ are normal unit vectors defined, for example, as follows:

$$N_- = (Nf_- \times Nh_-)/\|Nf_- \times Nh_-\|$$

$$N_+ = (Nf_+ \times Nh_+)/\|Nf_+ \times Nh_+\|$$

where the symbol "×" represents the cross product operator.

At the geological-time of deposition:
Nf−=−Nf+ (i.e., the normal unit vectors of fault surface 202 on opposite sides of the fault have substantially equal magnitudes and opposite directions at the geological-time of deposition).
Nh−=Nh+ (i.e., the normal unit vectors of horizons on opposite sides of fault surface 202 are substantially equivalent along a horizon deposited at the same geological-time).
N−=−N+ (i.e., the normal unit vectors, N, on opposite sides of fault surface 202 have substantially equal magnitudes and opposite directions at the geological-time of deposition).

Continuity of the gradients (grad u) and (grad v) at the geological-time of deposition may be expressed, for example, as follows:

$$(grad{-}u) \bullet Nf{-} = -(grad{+}u) \bullet Nf{+} \quad [5c]$$

$$(grad{-}u) \bullet Nh{-} = (grad{+}u) \bullet Nh{+} \quad [5d]$$

$$(grad{-}u) \bullet N{-} = -(grad{+}u) \bullet N{+} \quad [5e]$$

$$(grad{-}v) \bullet Nf{-} = -(grad{+}v) \bullet Nf{+} \quad [5f]$$

$$(grad{-}v) \bullet Nh{-} = (grad{+}v) \bullet Nh{+} \quad [5g]$$

$$(grad{-}v) \bullet N{-} = -(grad{+}v) \bullet N{+} \quad [5h]$$

where the symbol "•" represents the dot product operator and where (grad−w) and (grad+w) represent the gradient of any function w(x,y,z) at points f− and f+ 214 and 216, respectively. The functions u(x,y,z) and v(x,y,z) may be generated to honor constraints [5a-5b].

Generating Paleo-Geographic Coordinates u(x,y,z) and v(x,y,z)

Paleo-geographic coordinates u(x,y,z) and v(x,y,z) may be generated, for example, by solving the partial differential equations [3a-e] or [4a-c], for example as described herein. However, solving these equations is typically extremely difficult since the equations are dependent on each other and are non-linear. One current technique to solve these equations uses the following simplifications:

The geological time t(x,y,z) may be known at all points (x,y,z) in the modeled domain.
At any point (x,y,z) in the modeled domain, the unit vector, Nh(x,y,z), normal to the horizon at point (x,y,z) may be derived from the gradient of t(x,y,z) as follows:

$$Nh = (grad\ t)/\|grad\ t\|$$

If the differential equations for determining the paleo-geographic coordinates u(x,y,z) and v(x,y,z) are defined by the minimum-deformation type, then:
the non linear equations [3a] and [3b] are ignored;
the non linear equation [3c] may be replaced by the following linear equation:

$$(grad\ v) = Nh \times (grad\ u) \quad [3c_1]$$

where the symbol "×" represents the cross product operator; and
the linear equations [3d] and [3e] may remain unchanged.

If the differential equations for determining the paleo-geographic coordinates u(x,y,z) and v(x,y,z) are defined by the flexural-slip type, then:
the non linear equations [4a] and [4b] are ignored; and
for each given sampling point (x,y,z) in the 3D volume, an arbitrary pair of normal unit vectors (U,V) may be chosen in the plane of the horizon going through location (x,y,z). The non linear equation [4c] is replaced by the following linear equations:

$$(\text{grad } u) \cdot U = (\text{grad } v) \cdot v \qquad [4c_1]$$

$$(\text{grad } u) \cdot V = -(\text{grad } v) \cdot U \qquad [4c_2]$$

Equations [$4c_1$] and [$4c_2$] provide the following relationship, which partially approximates equations [4a] and [4b]:

$$\|\text{grad} H_u\| \sim \|\text{grad} Hv\| \qquad [4ab]$$

The following process computes the paleo-geographic coordinates u(x,y,z) and v(x,y,z) at each node of a given mesh covering the geological domain:
1) A 3D geological domain may be covered by a mesh M composed of 3D polyhedral cells. The edges of the cells may be tangent to a fault surface but do not cross these fault surfaces. In a preferred embodiment, the cells may be tetrahedral or hexahedral shaped.
2) Any function f(x,y,z) defined in the geological domain may be defined by the values of this function at the vertices of mesh M. The value of f(x,y,z) may be determined throughout the geological domain by interpolating values of the function from values determined at the vertices of the cell containing the point (x,y,z).
3) The geological-time function t(x,y,z) is assumed to be known throughout the geological domain.
4) A set $S(t_0)$ of sampling points where (u) and (v) are known may be generated as follows (other or different operations may be used):
   a) A geological-time $t_0$ is selected and an associated horizon $H(t_0)$ is generated corresponding thereto. The horizon $H(t_0)$ is a level surface of the given geological-time function t(x,y,z). The horizon $H(t_0)$ is composed, for example, of adjacent triangles.
   b) The set $S(t_0)$ of sampling points is composed of the vertices of the triangles of the generated horizon $H(t_0)$.
   c) A point, $p_0$, in the set $S(t_0)$ is selected. For example, point, $p_0$, of the set $S(t_0)$ may be the closest point in the set $S(t_0)$ to the center of the horizon $H(t_0)$.
   d) The values $u_s = u(x_s, y_s, z_s)$ and $v_s = v(x_s, y_s, z_s)$ may be determined for each sampling point $(x_s, y_s, z_s)$ in the set $S(t_0)$. The values $u_s$ and $v_s$ may be determined according to a known method. The values of $u_s$ and $v_s$ may be computed by known techniques so that equations [3a], [3b], [4a] and [4b] are satisfied for all points in the set $S(t_0)$.
5) "Control-points," constraints on the mesh M, may be added and may provide that, for each sampling point $(x_s, y_s, z_s)$ of $S(t_0)$:

$$u(x_s, y_s, z_s) = u_s; \text{ and } v(x_s, y_s, z_s) = v_s.$$

6) For each set $P_{CF}$ and each pair of points $(f_-, f_+)$ in $P_{CF}$, the linear equations [5a] to [5h] may be satisfied.
7) If the differential equations for determining the paleo-geographic coordinates u(x,y,z) and v(x,y,z) are defined by the minimum-deformation type, then, for each cell of the mesh M:
   a) Compute the gradient (grad t) of the geological-time function t(x,y,z) at point (x,y,z) and determine the normal unit vector Nh=(grad t)/∥grad t∥, which is normal to the horizon at point (x,y,z).
   b) Install constraints on functions u(x,y,z) and v(x,y,z) so that equations [3d], [3e] and [$3c_1$] are satisfied.
8) If the differential equations for determining the paleo-geographic coordinates u(x,y,z) and v(x,y,z) are defined by the flexural-slip type, then, for each cell of the mesh M:
   a) Compute the gradient (grad t) of the geological-time function t(x,y,z) at point (x,y,z) and determine the normal unit vector Nh=(grad t)/∥grad t∥, which is normal to the horizon at point (x,y,z).
   b) Generate a pair of unit vectors (U,V), which are normal to Nh.
   c) Install constraints on functions u(x,y,z) and v(x,y,z) so that equations [$4c_1$] and [$4c_2$] are satisfied.
9) Constraints may be applied throughout the geological domain so that the gradients of u(x,y,z) and v(x,y,z) are as constant as possible in a least squares sense.
10) Use the DSI method to compute the values of paleo-geographic coordinate functions u(x,y,z) and v(x,y,z) at the vertices of the mesh M so that the constrains and equations described in the aforementioned process are satisfied.
11) Stop Although the aforementioned process may be used to generate paleo-geographic coordinate functions u(x,y,z) and v(x,y,z), this mechanism may have several drawbacks:
   The functions u(x,y,z) and v(x,y,z) are typically dependant on the horizon $H(t_0)$ from which the sampling point values of (u) and (v) are determined.
   The functions u(x,y,z) and v(x,y,z) are typically dependant on the values of (u) and (v), which where sampled on $H(t_0)$.
   Techniques known in the art to compute the values of (u) and (v), where sampled on $H(t_0)$, typically do not provide a unique solution and only approximate equations [3a-e] or [4a-c].
   Equations [3a], [3b] and [4a], [4b] may be severely violated. As a consequence:
   when horizons are curved, the functions u(x,y,z) and v(x,y,z) deviate from equations [3a], [3b] and [4a], [4b].
   In fact, the gradients of u(x,y,z) and v(x,y,z) may vanish (i.e., approach zero) at some locations of the modeled domain, in which case, the corresponding functions u(x,y,z) and v(x,y,z) are absolutely incorrect.

Equations [3a], [3b] and [4a], [4b] define a deformation of a current geological structure (x,y,z) from its original state of deposition u(x,y,z) and v(x,y,z), which occurred with a minimum amount of energy when the current geological structure observed today at location (x,y,z) was planar at geological-time t(x,y,z). However, when the current structure is curved or irregular, the determined paleo-geographic coordinates u(x,y,z) and v(x,y,z) may violate equations [3a], [3b] and [4a], [4b] and thereby may generate erroneous coordinates in the G* space. Accordingly, a model defined by such erroneous paleo-geographic coordinates u(x,y,z) v(x,y,z) is typically inaccurate.

Therefore, there is a great need in the art for a mechanism to accurately model the paleo-geographic coordinate functions u(x,y,z) and v(x,y,z). In particular, there is a need in the art for a mechanism to accurately model the paleo-geographic coordinate functions corresponding to current structures that have curved, bent, or otherwise non-planar surfaces.

For simplicity and clarity of illustration, embodiments of the invention are described in two separate sections (elements from each may of course be combined in some embodiments).

The first section, entitled "Generating Axis and Co-axis Vectors", describes mechanisms which may be used according to embodiments of the present invention to generate unit vectors a(x,y,z) and b(x,y,z) referred to as "axis" and "co-axis", respectively.

The second section, entitled "Modeling in UVT Space" describes mechanisms which may be used according to embodiments of the present invention to generate the paleo-geographic coordinate functions u(x,y,z) and v(x,y,z) based on the geometry of current structures (x,y,z). To generate u(x,y,z) and v(x,y,z) based on the geometry of current structures, axis and co-axis vectors, a(x,y,z) and b(x,y,z), may be used. The axis and co-axis vectors may characterize the approximate local main directions of curvature of surface horizons in the current geological domain. The functions u(x,y,z) and v(x,y,z) may be solutions to a system of linear and independent equations based on the local axis and co-axis vectors, respectively. These linear and independent equations may replace the corresponding non-linear and interdependent equations [3a-e] and [4a-c] conventionally used in the art.

Embodiments of methods for processing subsurface data are described herein. Typically, input data to these methods includes seismic data, well data, or other data, which may be used by processes described herein, and other known processes, to model subsurface geological features.

Generating Axis and Co-Axis Vectors

Computing a Global Geological Axis

When a geologist models a planar cross section representative of a folded geological structure (e.g., curved), he/she always chooses a cross section plane orthogonal to a main structural direction defined by a vector (A). In practice, this cross section plane is intuitively chosen so that, for any location of a modeled point (x,y,z) on this cross section, the unit normal vector N(x,y,z) orthogonal to the horizon passing through the point (x,y,z) is, as much as possible, orthogonal to (A).

Figure 3:
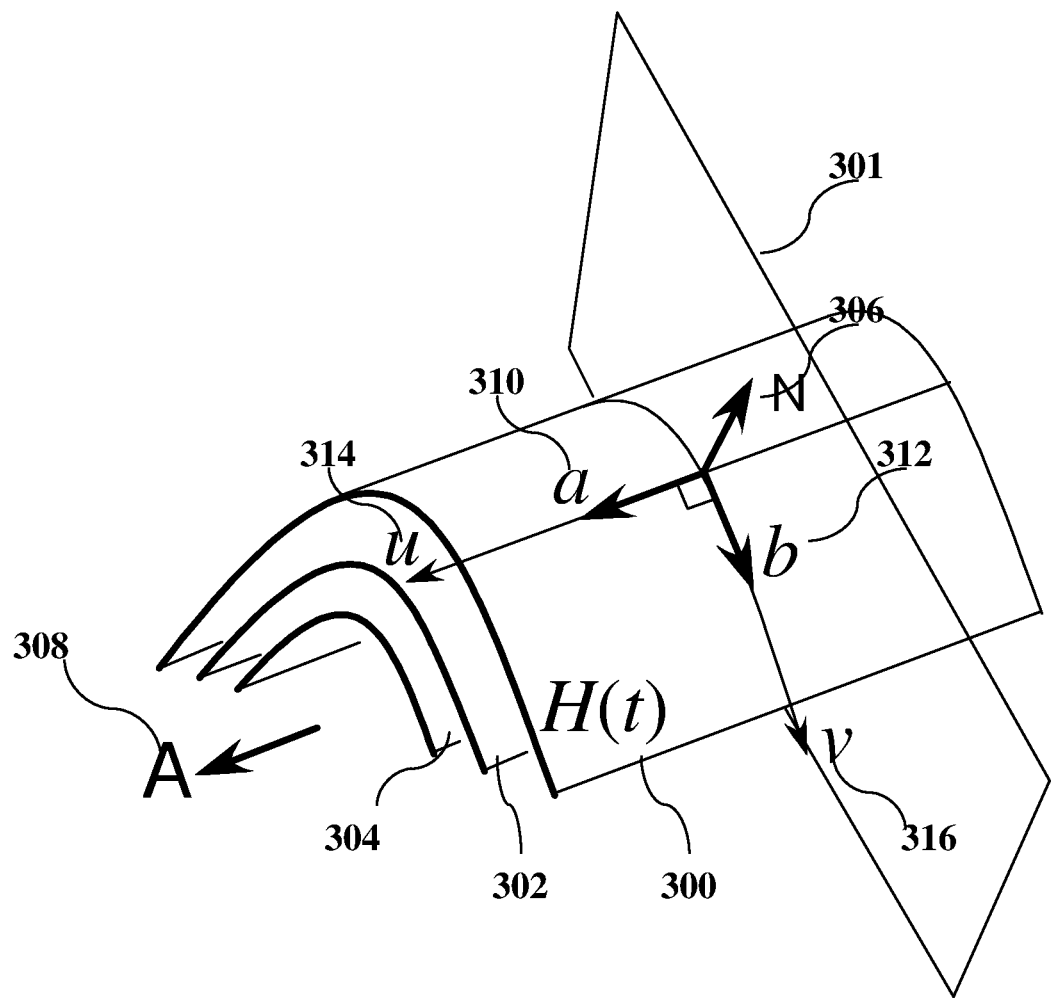
FIG. 3 is a schematic illustration of a global axis (A), a local axis a(x,y,z) and a co-axis b(x,y,z) vectors for defining paleo-geographic coordinates according to an embodiment of the invention.

Reference is made to FIG. 3, which schematically illustrates a model of horizons 300, 302, and 304, a normal unit vector N(x,y,z) 306, which is orthogonal to horizon 300 and a global geological axis (A) 308, which is itself approximately orthogonal to the unit vector 306, according to an embodiment of the invention. A cross section plane 301 may be chosen to be as much as possible, orthogonal to a global geological axis (A) 308. In practice and as shown in FIG. 3, for any point (x,y,z) on a horizon 300, a normal unit vector N(x,y,z) 306 orthogonal to horizon 300 at point (x,y,z) and approximately parallel to the cross section is also approximately orthogonal to A.

One embodiment of the invention defines global geological axis 308 as a vector (A) that satisfies the two following equations [6a] and [6b]:

$$\int_G (|A \bullet N(x, y, z)|)^2 dxdydz \quad \text{minimum} \quad [6a]$$

Subject to $\|A\|=1$ [6b]

where the symbol "•" represents the dot product operator and where $\int_G$ represents the integral operator over the studied geological domain G and "minimum" indicates that the vector (A) is selected to be the vector that generates a value of the integral of equation [6a] that is closest to zero.

The inventor of this patent application has demonstrated in a proof that the vector (A) solution of equation [6a] and [6b] is the Eigen vector associated with the smallest Eigen value of the matrix [m], where matrix [m] is defined, for example, as follows:

$$[m] = \int_G ([N(x, y, z)] \bullet [N(x, y, z)]^T) dxdydz \quad [7]$$

where the symbol "•" represents the dot product operator and where [N(x,y,z)] represents a column matrix of the components of normal unit vector N(x,y,z) 306 and $[N(x,y,z)]^T$ represents the transposition of the matrix [N(x,y,z)].

Embodiments of the invention provide a system and method to compute global geological axis 308 as a vector (A) associated with a studied geological domain G, for example, as follows (other operations or series of operations may be used, and the exact set of steps shown below may be varied):

1) Select a set of sampling points SG covering the geological domain G. For example, the sampling points may be the nodes of a regular mesh covering the geological domain for example or the centers of the cells of this mesh.
2) Define [m] to be a (3×3) symmetrical matrix initialized to the null matrix.
3) For each sampling point (x,y,z) in the set SG:
   a. Compute the normal unit vector 306, N(x,y,z), normal to horizon 300 at the location of the sampling point (x,y,z). For example, one can compute N(x,y,z) as follows:

$N(x,y,z)=\text{grad } t(x,y,z)/\|\text{grad } t(x,y,z)\|$ b. Compute the matrix [n] defined by $[n]=[N(x,y,z)] \bullet [N(x,y,z)]^T$ where the symbol "•" represents the dot product operation and where [N(x,y,z)] represents a column matrix of the x, y, and z components of N and $[N(x,y,z)]^T$ represents the transposition of column matrix [N(x,y,z)].
   c. Add matrix [n] to matrix [m].
4) Extract the Eigen vectors and Eigen values of the matrix [m] and set global geological axis 308, (A), to be parallel to the Eigen vector associated with the smallest Eigen value of [m].
5) Stop Computing Local Axis and Local Co-Axis The geological-time function t(x,y,z) may be defined throughout the geological domain G. One embodiment of the invention may generate a local axis a(x,y,z) 310 and a co-axis b(x,y,z) 312, which may characterize the local geometry of horizon 300. Local axis a(x,y,z) 310 and local co-axis b(x,y,z) 312 may be defined, for example, as follows.

For any point (x,y,z) modeled within G-space, the normal unit vector 306, N(x,y,z), normal to horizon 300, may be defined, for example, as follows:

$N=(\text{grad } t)/\|\text{grad } t\|$ [8], where (grad t) represents the gradient of the geological-time t(x,y,z) at the point (x,y,z).

For any point (x,y,z) modeled within G-space, the local axis a=a(x,y,z) 310 may be defined, for example, as follows:

$$a = \frac{N \times A \times N}{\|\{N \times A \times N\}\|},\qquad [9]$$

where the symbol "×" represents the cross product operator and where "A" represents the global geological axis 308, for example, defined by equations [6a] and [6b] and corresponding to the direction of the Eigen vector associated with the smallest Eigen value of matrix [m] as computed, for example, using the process described in the section entitled "Computing a Global Geological Axis".

For any point (x,y,z) modeled within G-space, the local co-axis b=b(x,y,z) 312 may be defined, for example, as follows:

$$b = \{N \times a\} \qquad [10],$$

where the symbol "×" represents the cross product operator and where "a" represents local axis a(x,y,z) 310, for example, defined by equation [9].

According to equations [9] and [10], local axis a(x,y,z) 310 and co-axis b(x,y,z) 312 are both located on a plane tangent to horizon 300 at point (x,y,z). In general, the variations of local axis a(x,y,z) 310 and co-axis b(x,y,z) 312 may characterize the geometry (e.g., the shape or curvature) of horizons in G-space. In a particular case when the modeled sedimentary terrains have a perfectly cylindrical structure (e.g., anticline or syncline) as shown in FIG. 3, local axis a(x,y,z) 310 and co-axis b(x,y,z) 312 correspond to the principal directions of curvature of the horizon at (x,y,z), e.g., corresponding to the directions in which the curvature of the horizon is minimum and maximum, respectively.

a(x,y,z) may be the direction corresponding to the minimum absolute value of principal curvature of horizon 300 at (x,y,z), b(x,y,z) may be the direction corresponding to the maximum absolute value of principal curvature of horizon 300 at (x,y,z).

The principal directions of curvature may be undefined at every singular location (x,y,z) where the principal curvatures are equal, e.g., at each point (x,y,z) where horizon 300 is locally tangent to a sphere. Such singular locations typically have no effect on the directions of local axis a(x,y,z) 310 and co-axis b(x,y,z) 312, which, as a consequence, may be considered as "smooth regularized" directions of principal curvatures.

According to embodiments of the invention, when the geological-time function t(x,y,z) is defined throughout the studied geological domain G, an embodiment of the following process may be used to compute local axis a(x,y,z) 310 and co-axis b(x,y,z) 312 associated with the geological domain G (other operations or series of operations may be used, and the exact set of steps shown below may be varied):

1) Compute global geological axis 308 (A) associated with the geological domain G, for example, using the process described in the section entitled "Computing a Global Geological Axis."
2) For any point (x,y,z) in the modeled domain, compute local axis a(x,y,z) 310 and co-axis b(x,y,z) 312 associated with the geological domain G, for example, using equations [8], [9] and [10], respectively.
3) Stop Visualizing Local Axes and Co-Axes To visualize the axis a(x,y,z) and co-axis b(x,y,z), an embodiment of the invention may proceed as follows (other operations or series of operations may be used, and the exact set of steps shown below may be varied):

1) Compute global geological axis 308 (A) associated with the geological domain G, for example, using the process described in the section entitled "Computing a Global Geological Axis."
2) Compute vector fields of local axis a(x,y,z) 310 and co-axis b(x,y,z) 312 associated with the geological domain G, for example, using the process described in the section entitled "Computing Local Axis and Local Co-axis."
3) Select a given geological time ($t_0$) and generate an associated horizon $H(t_0)$. The geological time ($t_0$) may be selected randomly, for example, automatically by incrementing a counter or entered manually by a user.
4) Select a set $SH(t_0)$ of sampling points located on $H(t_0)$. The sampling points may be selected, for example, by a user inspecting data and determining that the sampling points correspond to the horizon $H(t_0)$, or alternatively, by a computing module automatically generating the set of points which correspond to the horizon $H(t_0)$.
5) Choose a 2D or 3D graphical user interface on a display device (e.g., display 180 of FIG. 6), and for each point $(x_s, y_s, z_s)$ of $SH(t_0)$, display:
   a) a point located at $(x_s, y_s, z_s)$
   b) a vector rooted at $(x_s, y_s, z_s)$ and collinear with $a(x_s, y_s, z_s)$
   c) a vector rooted at $(x_s, y_s, z_s)$ and collinear with $b(x_s, y_s, z_s)$
6) Stop Modeling in UVT Space Modeling Paleo-Geographic Coordinates (u,v)

The "minimal-deformation" and "flexural-slip" types may be considered two "extremes" of a continuum of possible types of tectonic activity encountered in sedimentary geology. These types of tectonic activity are of particular importance when modeling geological structures. Conventional methods used to compute paleo-geographic coordinate functions u(x,y,z) and v(x,y,z) typically violate equations [3a] and [3b] and [4a] and [4b], which define minimal energy deformations when the geographic coordinate functions are generated to model curved surface structures. Such violations may render the paleo-geographic coordinate model inaccurate.

Furthermore, conventional paleo-geographic coordinate functions u(x,y,z) and v(x,y,z) may be generated by solving simultaneous multiple equations (e.g., inter-dependent equations [3a-e] and [4a-c]), where the equations are non-linear (i.e., having order 2 or greater). Since these equations are inter-dependent and highly non-linear, computations are extremely difficultly and require massive amounts of computer memory and processing time.

Embodiments of the invention may provide a system and method for modeling a geological subsurface at the time when the subsurface was deposited using linear and independent equations, such that the subsurface is deformed by a minimum amount of energy since it was deposited.

In one embodiment of the invention, for each current subsurface location (x,y,z) (e.g., a node of a mesh) within a geological domain G, inter-dependent and non-linear equations [3a-e] and [4a-c] may be replaced, for example, by linear and independent equations [11a] and [11b] and [12a] and [12b], respectively.

Subsurface structures deformed by the minimal-deformation type of tectonic activity may be modeled by paleo-geographic coordinate functions u(x,y,z) and v(x,y,z) satisfying the following relationships (e.g., replacing conventional models defined by equations [3a-e]):

$$\mathrm{grad}\ u(x,y,z) \sim a(x,y,z) \quad [11a]$$

$$\mathrm{grad}\ v(x,y,z) \cdot b(x,y,z) \quad [11b]$$

where the symbol "~" denotes "approximately equal".

Subsurface structures deformed by the flexural-slip type of tectonic activity may be modeled by paleo-geographic coordinate functions u(x,y,z) and v(x,y,z) satisfying the following relationships (e.g., replacing conventional models defined by equations [4a-c]):

$$\mathrm{grad}H\ u(x,y,z) \sim a(x,y,z) \quad [12a]$$

$$\mathrm{grad}H\ v(x,y,z) \sim b(x,y,z) \quad [12b]$$

where the symbol "~" denotes "approximately equal".

Equations [11a] and [11b] are linear and independent from each other and, furthermore, they are compatible with all of equations [3a-e].

Equations [12a] and [12b] are linear and independent from each other and, furthermore, they are compatible with all of equations [4a-c].

The paleo-geographic coordinates u(x,y,z) and v(x,y,z) may be computed within the geological domain G, for example, as follows (other operations or series of operations may be used, and the exact set of steps shown below may be varied):

1. Cover a 3D geological domain of interest by a mesh M composed of adjacent 3D polyhedral cells. Each cell may include faces, edges and vertices (e.g., nodes). The edges of the cell may be tangent to fault surfaces but typically do not cross these fault surfaces. In a preferred embodiment, the cells may be tetrahedral or hexahedral cells, although other cell shapes may be used.
2. Any function f(x,y,z) in the geological domain may be defined by its values at the vertices of the mesh M. The value f(x,y,z) may be locally interpolated (e.g., by a linear approximation) at any point (x,y,z) in the model from the values at the vertices of the cell containing the point (x,y,z).
3. The geological-time function t(x,y,z) is assumed to be given everywhere in the geological domain. For example, the geological time function t(x,y,z) may be an arbitrary monotonic increasing function of the real (unknown) geological-time.
4. Local axis a(x,y,z) and local co-axis b(x,y,z) vectors may be generated throughout the geological domain, for example, according to the process described in the section entitled "Modeling Paleo-Geographic Coordinates (u,v)". Local axis and local co-axis vectors may characterize the local curvature of surface horizons in the current geological domain.
5. A point $(x_0,y_0,z_0)$ in the geological domain may be selected so that $u(x_0,y_0,z_0)$ and $v(x_0,y_0,z_0)$ satisfy the following equations. For example, a "Control-Point" constraint may be installed using the DSI method so that $u(x_0,y_0,z_0)$ and $v(x_0,y_0,z_0)$ satisfy the following equations, as is known $$U(x_0,y_0,z_0) = u_0;\ v(x_s,y_s,z_s) = v_0$$

where $u_0$ and $v_0$ may be two arbitrarily chosen constants. For example, $(x_0,y_0,z_0)$ may be a point located at approximately the center of the geological modeled domain and $u_0$ and $v_0$ may be two null values.

6. Each pair of points $(f-,f_+)$ belonging to the set $P_{CF}$ and located in G-space on opposite sides of a fault at the intersection of a fault stria with a horizon may satisfy equations [5a] to [5h]. For example, equations [5a] to [5h] may be installed as linear constraints [5a] to [5h] of the DSI method, as is known or any equivalent method 7. Subsurface structures deformed by the minimal-deformation type of tectonic activity may be assigned paleo-geographic coordinate functions u(x,y,z) and v(x,y,z) generated, for each cell or each node (e.g., vertex) of mesh M, for example, as follows:
   a. Compute the local axis a(x,y,z) and co-axis b(x,y,z); and
   b. Install the linear equations [11a] and [11b] as constraints to be satisfied, e.g., in a least squares sense, by functions u(x,y,z) and v(x,y,z). For example, equations [11a] and [11b] may be installed as linear constraints in the DSI method to be satisfied, for example, in a least squares sense by functions u(x,y,z) and v(x,y,z).

8. Subsurface structures deformed by the flexural-slip type of tectonic activity may be assigned paleo-geographic coordinate functions u(x,y,z) and v(x,y,z) generated, for each cell or each node of mesh M, for example, as follows:
   a. Compute the local axis a(x,y,z) and co-axis b(x,y,z); and
   b. Install the linear equations [12a] and [12b] as constraints to be satisfied, e.g., in a least squares sense, by functions u(x,y,z) and v(x,y,z). For example, equations [12a] and [12b] may be installed as linear constraints in the DSI method to be satisfied, for example, in a least squares sense by functions u(x,y,z) and v(x,y,z).

9. Constraints may be installed everywhere in the geological domain so that the gradients of u(x,y,z) and v(x,y,z) are as constant as possible, e.g., in a least squares sense.

10. The DSI method or any other equivalent approximation method known in the art may be applied to compute the values of the geological-time function t(x,y,z) at the vertices of mesh M, e.g., so that all the equations and/or constraints defined above are satisfied.

11. Stop

Equations [11a], [11b] and [12a], [12b] define paleo-geographic coordinate functions u(x,y,z) and v(x,y,z) of structures which have undergone minimal-deformation type or flexural-slip type deformations, respectively. The paleo-geographic coordinates u(x,y,z) and v(x,y,z) may be defined by the axis and co-axis vectors, a(x,y,z) and b(x,y,z), which may characterize the local curvature of surface horizons in the current geological domain. The paleo-geographic coordinates u(x,y,z) and v(x,y,z) may be solutions to a system of equations which are linear and independent from each other and are therefore relatively simple to solve, as compared to the corresponding inter-dependent and non-linear equations (i.e., [3a-e] and [4a-c]) of the conventional model. For example, equations [11a], [11b] and [12a], [12b] may easily be specified as DSI constraints and solved in a least squares sense using the DSI method.

Conventional paleo-geographic coordinates (e.g., defined by equations [3a] and [3b] and [4a] and [4b]) typically model minimum energy deformations of a current horizon only when the horizon is substantially planar and deviate from minimum energy deformations when the horizons are curved. According to embodiments of the invention, the paleo-geographic coordinate functions u(x,y,z) and v(x,y,z) are generated based on the geometry of the current structures (e.g., defined by equations [11a] and [11b] and [12a] and [12b]). The paleo-geographic coordinate functions u(x,y,z) and v(x,y,z), model minimum energy deformations between the original depositional model to the current folded and faulted model as a function of geometry of the current horizon. Since the minimum energy deformations are based on the geometry (e.g., the curvature or irregular shape) of the current structures themselves, the paleo-geographic coordinate functions model minimum energy deformations regardless of the curvature of the current structures.

Contrary to other methods known in the art, embodiments of the aforementioned process above are stable and may honor all the constraints [4a-c] and [5a-b], on average, even in the extreme cases where horizons are severely folded or flat.

Optimizing Paleo-Geographic Coordinates u(x,y,z) and v(x,y,z)

Paleo-geographic coordinate functions u(x,y,z) and v(x,y,z) may be optimized for accuracy by correcting model fractures e.g., defined by a strain tensor E(x,y,z), using observed fracture data. Initially, at depositional times, the horizons may be assumed to have been approximately flat and horizontal. Throughout geological time, these horizons may be impacted and shifted by tectonic forces and, as observed today, are now folded and faulted. From a geomechanical perspective, at any location or point (x,y,z) in the current geological G-space, these tectonic transformations may be characterized by strain or relative displacement of the particle (x,y,z). The strain at location (x,y,z) may be defined e.g. by a strain tensor E(x,y,z). The deformations may be modeled by a strain tensor E(x,y,z) and the directions of the potential fractures at that location (x,y,z) may be defined by the Eigen vectors of the strain tensor. A potential direction of fracture at location (x,y,z), characterized by strain tensor E(x,y,z) may indicate that if a fracture occurs at location (x,y,z), the direction of this fracture should be a function of the eigen vectors of E(x,y,z).

In terms of the GeoChron model, at any location (x,y,z) in the G-space, the strain tensor E(x,y,z) may be a function of the paleo-geographic coordinates u(x,y,z) and v(x,y,z) in G*-space. Therefore, the directions of potential fractures E(x,y,z) may be indirectly controlled by the functions u(x,y,z) and v(x,y,z). Thus, determining a more accurate strain tensor based on observed factures may serve to determine improved paleo-geographic coordinate functions u*(x,y,z) and v*(x,y,z). Moreover, on average, fractures may be perpendicular to the strain tensor's eigen vector having the largest eigen value. The new functions u*(x, y, z|A, B, C, ... ) and v*(x, y, z|A, B, C, ... ) may be chosen or adjusted from u(x,y,z) and v(x,y,z) in such a way that the eigen direction e*(x, y, z|A, B, C, ... ) of the new strain tensor E*(x, y, z|A, B, C, ... ) associated with the largest eigen value of E*(x, y, z|A, B, C, ... ) becomes approximately orthogonal to the fracture plane observed at location (x,y,z). For example, if n(x,y,z) is a normal vector orthogonal to the fracture plane observed at location (x,y,z), u*(x, y, z|A, B, C, ... ) and v*(x, y, z|A, B, C, ... ) may be determined in such a way that the following criterion J((x, y, z|A, B, C, ... ) is minimized:

$$J(x,y,z|A,B,C,\ldots)=\|e^*(x,y,z|A,B,C,\ldots)n(x,y,z)\|,$$

where $\|a\ b\|$ is the norm of the cross product of two vectors "a" and "b", Tuning parameters A, B, C, etc. may thus be adjustment values that minimize the norm of the cross product of the eigen vector of strain tensor E* and vectors orthogonal to observed fractures. The tuning parameters may each have constant values or they may be functions of location (x,y,z). Minimizing such a criterion or any other equivalent criterion may amount to minimizing the discrepancy between the direction of fracture actually observed and the direction of potential fracture predicted deduced from the eigen vectors of E(xi, yi, zi|Ai, Bi, ... ).

Regardless of the method used to compute an initial pair of functions u(x,y,z) and v(x,y,z) (some of which are described herein), a new and improved pair of functions u*(x, y, z|A, B, C, ... ) and v*(x, y, z|A, B, C, ... ) (where A, B, C, ... are parameters that correct an initial strain tensor to generate a new strain tensor E*(x, y, z|A, B, C, ... ) based on observed fractures) may be determined by incorporating observed fracture points.

New functions u*(x, y, z|A, B, C, ... ) and v*(x, y, z|A, B, C, ... ) may depend on initial functions u(x,y,z) and v(x,y,z) and a set of parameters (A, B, C, ... ). The set of turning parameters (A, B, C, ... ) values may be adjusted or "tuned" so that the eigen directions of the new strain tensor E*(x, y, z|A, B, ... , C) more closely match observed directions of fractures than the initial strain tensor. For example, the "Galilean transformation model" may be used to generate improved paleo-geographic coordinates u*(x,y,z) and v*(x,y,z) from the initially computed u(x,y,z) and v(x,y,z), such that the new coordinates u*(x,y,z) and v*(x,y,z) differ from the initially computed u(x,y,z) and v(x,y,z) by a constant relative motion A t(x,y,z) and B t(x,y,z), respectively. In another example, the "Shearing mapping model" may generate improved paleo-geographic coordinates u*(x,y,z) and v*(x,y,z) by displacing each point in one reference horizon in a fixed direction by an amount proportional to the initial coordinates u(x,y,z) and v(x,y,z). The these two models are described in the below equations where the number of correction parameters is limited to two parameters (A, B), although any number of parameters may be used:

Galilean transformation model:

$$u^*(x,y,z|A,B)=u(x,y,z)-A\ t(x,y,z)$$

$$v^*(x,y,z|A,B)=v(x,y,z)-B\ t(x,y,z)$$

Shearing mapping model:

$$u^*(x,y,z|A,B)=u(x,y,z)-A\ v(x,y,z)$$

$$v^*(x,y,z|A,B)=v(x,y,z)-B\ u(x,y,z)$$

Figure 11:
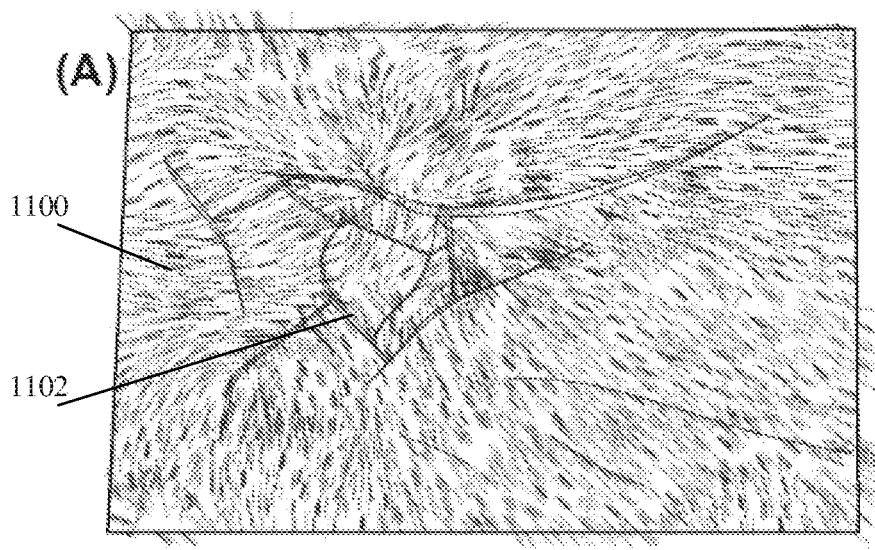
FIG. 11 is an illustration comparing two strain tensors, according to an embodiment of the invention.
Figure 11:
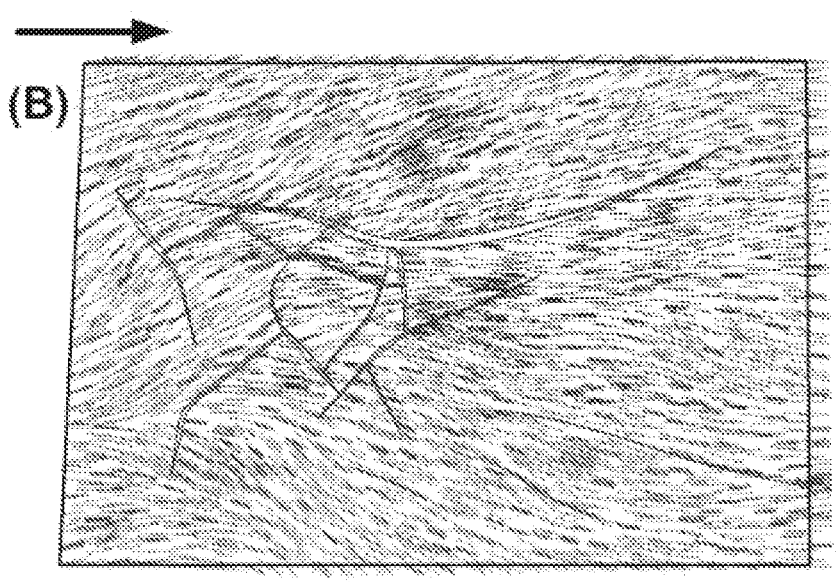

FIG. 11 is an illustration comparing two strain tensors, according to embodiments of the invention. In section A, field lines 1100 representing E(x,y,z), the directions of potential fractures, may be determined based on the paleo-geographic functions u(x,y,z) and v(x,y,z). The initial derivation of u(x,y,z) and v(x,y,z) may consider curved or irregular horizons at deposition times, or the geometry of present structures, as described herein in sections "Generating Axis and Co-Axis Vectors" and "Modeling in UVT Space". By accounting for observed fractures 1102 and calculating tuning parameters, improved paleo-geographic function u*(x,y,z) and v*(x,y,z) may be illustrated in an improved strain tensor E*(x,y,z). Section B illustrated that improved field lines representing the E*(x,y,z) directions of potential fractures more closely fit the observed fractures in the horizon.

The following procedure may incorporate these concepts and improve paleo-geographic coordinates other operations or series of operations may be used, and the exact set of steps shown below may be varied):

1) Identify the set {F1, F2, ... Fn} of families of fractures observed in the studied geological domain. Fractures and families of fractures may be identified according to methods known in the art. Each family of fracture may be generated by one tectonic episode involving a main direction of deformation. There may be as many families of fractures as there are tectonic episodes. In practice, fractures may be observed at sampling locations along well paths and may be characterized by the (x,y,z) coordinates of the sampling location and the components of unit normal vector (Nx,Ny,Nz) orthogonal to the fracture plane at that sampling location. Using a classification technique known in the art, the components of the observed normal vectors may be classified into families corresponding to the families of observed fractures.

2) For each family of fractures Fi:
   a. Choose a set of initial paleo-geographic coordinate functions u(x,y,z) and v(x,y,z).
   b. Choose a mathematical model (e.g., Galilean transformation, Shearing mapping, or other model) for the new optimized paleo-geographic coordinate functions u*(x, y, z|A, B, C, ...) and v*(x, y, z|A, B, C, ...).
   c. Choose a set of sampling points {($x_1,y_1,z_1$), ($x_2,y_2,z_2$), ($x_n,y_n,z_n$)} distributed on the surfaces of the family of fractures F.
   d. For each sampling point ($x_i,y_i,z_i$) of F, determine the optimal numerical correction ($A_i$, $B_i$, ...) for minimizing the discrepancy between the direction of fracture actually observed and the direction of potential fracture predicted. This may be deduced from the eigen values of E($x_i$, $y_i$, $z_i$|$A_i$, $B_i$, ...).
   e. Based on the numerical corrections, ($A_i$, $B_i$, ...) for each point, determine appropriate tuning parameters (A, B, ...), for example by:
      choosing the most frequent values (median) of (Ai, Bi, ...) or averages of the values (Ai, Bi, ...); or replace (A, B, ...) by varying piecewise continuous functions smoothly approximating the sampled values (Ai, Bi, ...). In this case, tuning parameters (A, B, ...) may themselves be functions which depend on coordinates (x,y,z).
   f. Determine new functions u*(x, y, z|A, B, ...) and v*(x, y, z|A, B, ...) based on the mathematical model chosen in step 2b (e.g., Galilean transformation, Shearing mapping, or others).
3) Stop.

Quality Control and Editing Paleo-Geographic Coordinates (u,v)

Figure 4:
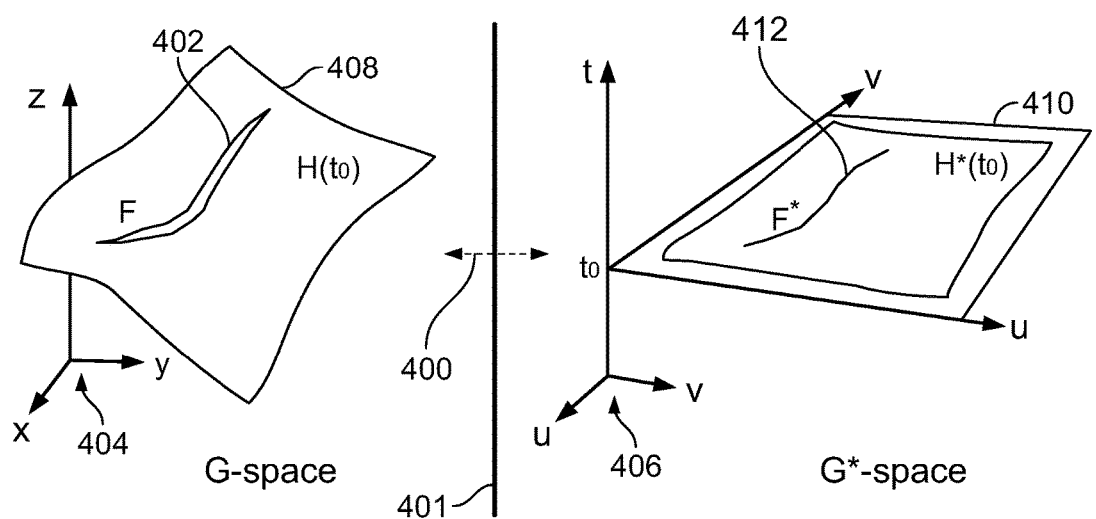
FIG. 4 is a schematic illustration of a horizon fractured by a fault in a model of a current geological structure and the corresponding continuous horizon in a model of the original deposition of the geological structure according to an embodiment of the invention.

Reference is made to FIG. 4, which schematically illustrates a horizon transformed by a uvt-transformation 400 between two 3D spaces G and G* (separated by line 401) according to an embodiment of the invention. uvt-transformation 400 may be defined by functions {u(x,y,z),v(x,y,z), t(x,y,z)}, which transform each point (x,y,z) of a curved or non-planar horizon H(to) 408 in the geological G-space 404 to a point {u(x,y,z),v(x,y,z),t(x,y,z)} of a flat or planar horizon H*($t_0$) 410 in the depositional G*-space 406 (e.g., according to equations [1] and [2]). t(x,y,z) is a geological-time function, which may be generated according to mechanisms known in the art. u(x,y,z) and v(x,y,z) are paleo-geographic coordinates functions, which model horizon 410, e.g., the location at which each point (x,y,z) of a horizon 408 was originally deposited at a time, $t_0$. Paleo-geographic coordinates functions u(x,y,z) and v(x,y,z) may be generated according to mechanisms described herein, e.g., in the section entitled "Modeling Paleo-Geographic Coordinates (u,v)".

Consider a curved horizon H($t_0$) 408 located in the (x,y,z) geological space G 404 and consider its image, horizon H*($t_0$) 410 located in the depositional (u,v,t) space G* 406. It may be observed that:
   Horizon H($t_0$) 408 may be curved and may be cut by one or more faults 402. The resulting horizon H($t_0$) 408 may for example have a hole or tear in its surface corresponding to the trace of the fault on that horizon.
   Horizon H*($t_0$) 410 may be substantially flat and may be contained in a horizontal plane at altitude ($t_0$) in G*-space 406. The horizontal plane at ($t_0$) may define the geometry of horizon H($t_0$) 408 at the depositional time before the tectonic events occurred which generated fault 402.
   Whether or not horizon H($t_0$) 408 includes holes or tears generated by faults 402, embodiments of the invention may transform horizon H($t_0$) 408 to generate horizon H*($t_0$) 410, which is substantially flat (e.g., planar) and substantially continuous (e.g., without any holes or tears). As shown in FIG. 4, uvt-transformation 400 maps the border of the hole generated by of fault 402 in G-space 404 to a line (or curve) F* 412 having no opening and substantially no discontinuities with the horizon H*($t_0$) 410 (for example, when constraints [5a] and [5b] are perfectly honored).

Reference is again made to FIG. 2, in which a pair of points (f–,$f_+$) 214 and 216 are located on opposite sides of fault 202 at the intersection of the fault stria 212 with a horizon 208. When constraints [5a] and [5b] are not honored, the pair of points (f–,$f_+$) 214 and 216 may form gaps and/or overlaps when they are transformed from G-space to G*-space, as shown in FIG. 5.

Figure 5:
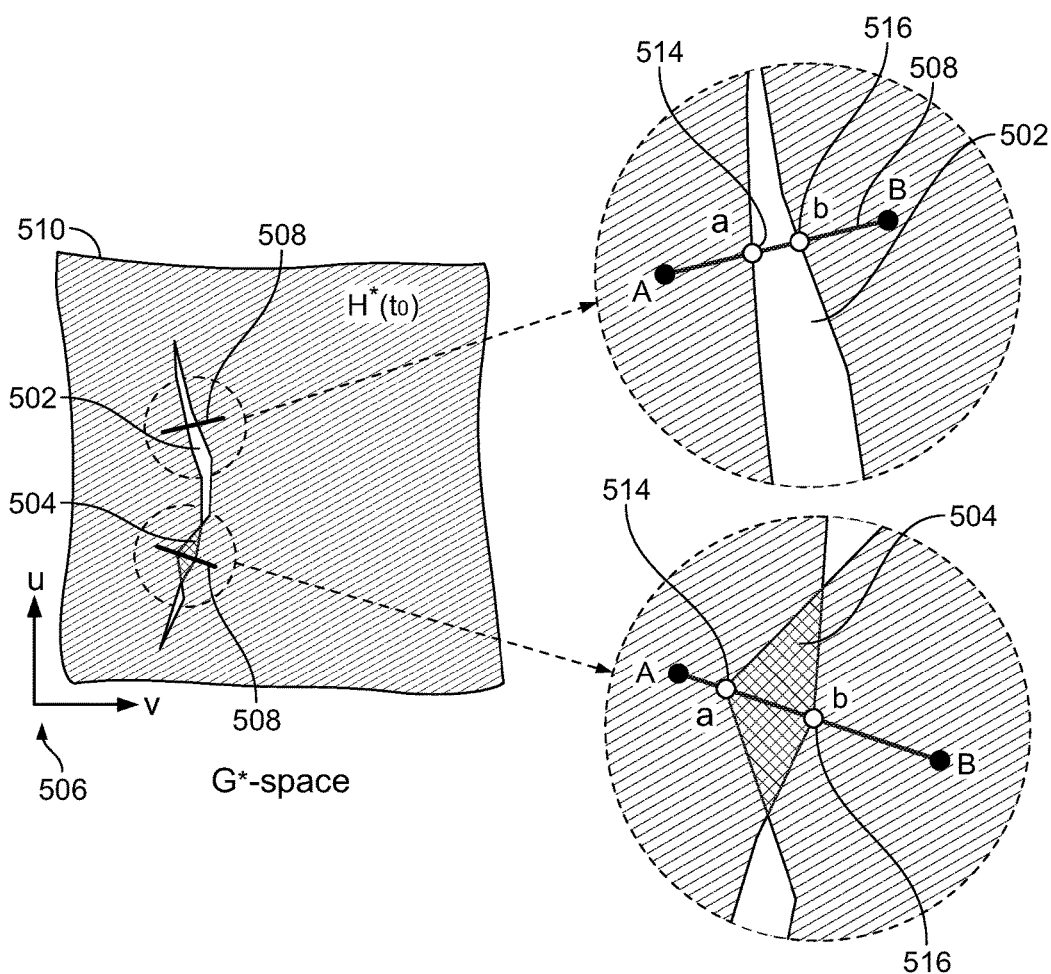
FIG. 5 is a schematic illustration of a modeled horizon simulating erroneous gaps and overlapping regions, which may be identified and corrected according to an embodiment of the invention.

Reference is made to FIG. 5, which schematically illustrates a top view of a flat horizon H*($t_0$) 510 having pairs of points separated by one or more gaps 502 and/or joined by one or more overlaps 504 in the depositional G*-space 506.

Embodiments of the invention provide a system and method for displaying and removing gaps 502 and/or overlaps 504 in horizon H*($t_0$) 510 in G*-space 506.

According to embodiments of the invention, as shown in FIG. 5, to control the quality of a given pair of paleo-geographic coordinates (u,v), a process may proceed, for example, as follows (other operations or series of operations may be used, and the exact set of steps shown below may be varied):

1. Select a value ($t_0$) for the geological-time corresponding to a horizon H*($t_0$) 510 in depositional G*-space 506.
2. Display horizon H*($t_0$) 510, which is substantially flat (e.g., planar), on a 2D or 3D graphical user interface on a display device, for example, a computer monitor (e.g., display 180 of FIG. 6).
3. Determine, for example by visual inspection, if horizon H*($t_0$) 510 includes any gaps 502 or overlaps 504 (e.g., or a node, cell, edge, face, vertex, or point associated with a gap or overlap), for example, transformed from points bordering faults in the corresponding horizon H($t_0$) in G-space. If gaps 502 or overlaps 504 are detected in horizon H*(t₀) 510, proceed to step (1) in the next series of steps to correct and/or remove these erroneous points.

4. If a subsequent horizon exists, select a new value ($t_0$) corresponding thereto and return to step (2) using the new value to control the quality of the paleo-geographic coordinates (u,v) on the subsequent horizon.

5. Stop

In one embodiment, when gaps 502 or overlaps 504 are detected in G*-space 506 (e.g., as in step (3) above), a process such as the following may be executed by a computing module interactively controlled by user input, to correct corresponding pairs of points ($f_+$,$f_-$) on a fault in G-space (other operations or series of operations may be used, and the exact set of steps shown below may be varied):

1. Display horizon H*(t₀) 510, which is substantially flat (i.e., planar), on a 2D or 3D graphical user interface on a display device (e.g., display 180 of FIG. 6), for example, a computer monitor.

2. for each point (u,v) (e.g., or node, cell, edge, face, or vertex) of horizon H*(t₀) 510 where a gap 502 or overlap 504 is detected:

a. A user may provide input. For example, a user may interactively draw a segment (A,B) 508 onto the display of horizon H*(t₀) 510 so that (A,B) intersects the "pathological" border of the gap 502 or overlap 504 (e.g., surrounding a hole, tear or overlap in horizon H*(t₀) 510). A user may operate a mouse or other pointing device to control a cursor on the graphical user interface to draw segment 508 onto the graphic display of horizon H*(t₀) 510. For example, the user may select two endpoints A and B and segment 508 may be the connection between these endpoints. Alternatively, the user may draw the full extension of a curve or line segment 508.

b. A computing module may compute the intersection points (a,b) of segment (A,B) 508 with the pathological border of the gap 502 or overlap 504.

c. Optionally, display horizon H(t₀) 408 in G-space, on a 2D or 3D graphical user interface on a display device, for example, a computer monitor (e.g., display 180 of FIG. 6).

d. A user may identify by inspection the pair of points (f−,f+) on the border of H(t₀) such that intersection point (a) is the image of (f−) and intersection point (b) is the image of (f+) by the uvt-transformation; the user may provide this input to the computing device. Alternatively, a computing module may compute automatically the pair of points (f−,f+) on the border of H(t₀) using the reverse uvt-transformation of the points (a) and (b).

e. Constraints located in the neighborhood of (f−,f+) may be removed from the set of pairs of points $P_{CF}=\{(f_{1-},f_{1+}), (f_{2-},f_{2\pm}), \ldots, (f_{n-},f_{n+})\}$, for example, automatically by computing module or manually by a user.

f. Add the pair of new points (f−,f+) resulting from step (2d) to the set $P_{CF}$.

3. Repeat step (2) if there is another point (u,v) on horizon H*(t₀) 510 where a gap 502 or overlap 504 is detected.

4. If modifications of the set $P_{CF}$ occurred in steps (2e) and (2.f) above, then, using the process described in the section entitled "Modeling Paleo-Geographic Coordinates (u,v)", re-compute the paleo-geographic coordinates (u,v).

5. Stop

Erosion and tectonic activity through time transform an initially uniform stratified terrain composed of continuous and level surfaces to a terrain fractured by faults forming discontinuities across the originally continuous horizons. Accordingly, to model the original time of deposition from data collected from the current subsurface structures (e.g., to "reverse time"), the model may simulate a reversal of such the erosion and tectonic activity.

Embodiments of the invention provide a system and method for transforming a current model to a corresponding model at the time of geological deposition. In one example, a horizon modeling a surface with discontinuities induced by faults may be transformed into a corresponding modeled horizon at a time of geological deposition, e.g., before the formation of the faults, so that the borders of cuts induced by faults on the horizon are joined or "sewed" together and the horizon is transformed into a single substantially continuous level planar surface horizon. A model of the current subsurface features (e.g., the current model) which may be deformed according to a minimal-deformation or flexural-slip tectonic style, may be transformed to the geological-time of the deposition by using paleo-geographic coordinates and geological-time function coordinates. The paleo-geographic coordinates u(x,y,z) and v(x,y,z) model the location of a particle of sediment when the particle was originally deposited during a certain time period, t(x,y,z).

Paleo-geographic coordinate functions u(x,y,z) and v(x,y,z) may be generated based on the geometry of current structures at location (x,y,z) in the geological G-space. To generate u(x,y,z) and v(x,y,z) based on the geometry of current structures, an axis and a co-axis vectors, a(x,y,z) and b(x,y,z), may be generated at any location (x,y,z) in the geological G-space. The axis and co-axis vectors may characterize the directions of local curvatures of horizons in the current geological domain G. Paleo-geographic coordinate functions u(x,y,z) and v(x,y,z) are characterized by equations that may depend on the geometry of current structures at the point (x,y,z) location (e.g., the axis and co-axis vectors), which are linear and independent from each other. According to embodiments of the invention, the paleo-geographic coordinates may be defined so that the deformation observed today on the current model (e.g., the fault fracture, erosion or tectonic activity) occurred using a minimal amount of energy.

A deformation from an initial (e.g., flat) depositional model to a current model may be a change in location by some or all points from one model to the other. The deformation may occur in infinitely many ways. Depending on the way in which the structures were deformed, a different amount of energy may be used to move a modeled particle from an initial location in the depositional model to a current location in the current model. A deformation may be considered to use a minimal amount of energy when, for example, the amount of energy corresponding to the deformation is substantially less than (or equal to) an amount of energy corresponding to another or all other deformations. For example, a point may be deformed from a location in one model to the other along a path using a minimal amount of energy, e.g., corresponding to an average minimum of the squared components of the resulting strain tensor.

According to embodiments of the invention, a depositional model may be generated in which geological terrains were mainly deformed in the direction of the local co-axis b(x,y,z) 312 in FIG. 3. Therefore, regardless of the curvature of horizons of the current model, a depositional model may be formed from the current model with a minimum deformation between the current model and the depositional model.

Reference is made to FIG. 6, which schematically illustrates a system including a transmitter, receiver and computing system in accordance with an embodiment of the present invention. Methods disclosed herein may be performed using a system 105 of FIG. 6. In other embodiments, methods used herein may be performed by different systems, having different components.

System 105 may include a transmitter 190, a receiver 120, a computing system 130, and a display 180. The aforementioned data, e.g., seismic data and well markers used to form intermediate data and finally to model subsurface regions, may be ascertained by processing data generated by transmitter 190 and received by receiver 120. Intermediate data may be stored in memory 150 or other storage units. The aforementioned processes described herein may be performed by software 160 being executed by processor 140 manipulating or configured to (e.g., by being programmed) manipulate the data.

Transmitter 190 may transmit signals, for example, acoustic waves, compression waves or other energy rays or waves, that may travel through subsurface (e.g., below land or sea level) structures. The transmitted signals may become incident signals that are incident to subsurface structures. The incident signals may reflect at various transition zones or geological discontinuities throughout the subsurface structures. The reflected signals may include seismic data.

Receiver 120 may accept reflected signal(s) that correspond or relate to incident signals, sent by transmitter 190. Transmitter 190 may transmit output signals. The output of the seismic signals by transmitter 190 may be controlled by a computing system, e.g., computing system 130 or another computing system separate from or internal to transmitter 190. An instruction or command in a computing system may cause transmitter 190 to transmit output signals. The instruction may include directions for signal properties of the transmitted output signals (e.g., such as wavelength and intensity). The instruction to control the output of the seismic signals may be programmed in an external device or program, for example, a computing system, or into transmitter 190 itself.

Computing system 130 may include, for example, any suitable processing system, computing system, computing device, processing device, computer, processor, or the like, and may be implemented using any suitable combination of hardware and/or software. Computing system 130 may include for example one or more processor(s) 140, memory 150 and software 160. Data 155 generated by reflected signals, received by receiver 120, may be transferred, for example, to computing system 130. The data may be stored in the receiver 120 as for example digital information and transferred to computing system 130 by uploading, copying or transmitting the digital information. Processor 140 may communicate with computing system 130 via wired or wireless command and execution signals. Memory 150 may be configured to store data 155 and software 160.

Memory 150 may include cache memory, long term memory such as a hard drive, and/or external memory, for example, including random access memory (RAM), read only memory (ROM), dynamic RAM (DRAM), synchronous DRAM (SD-RAM), flash memory, volatile memory, non-volatile memory, cache memory, buffer, short term memory unit, long term memory unit, or other suitable memory units or storage units. Memory 150 may store instructions (e.g., software 160) and data 155 to execute embodiments of the aforementioned methods, steps and functionality (e.g., in long term memory, such as a hard drive). Data 155 may include, for example, raw seismic data collected by receiver 120, instructions for building a mesh, instructions for partitioning a mesh, and instructions for processing the collected data to generate a model, or other instructions or data. Memory 150 may also store instructions to remove local overlaps or gaps in the (u,v,t) depositional G*-space. Memory 150 may store a geological-time function, a model representing a structure when it was originally deposited (e.g., in uvt-space) and/or a model representing the corresponding structure in a current time period (e.g., in xyz-space). Memory 150 may store cells, nodes, voxels, etc., associated with the model and the model mesh. Memory 150 may also store forward and/or reverse uvt-transformations to transform current models in xyz-space to models in uvt-space, and vice versa. Data 155 may also include intermediate data generated by these processes and data to be visualized, such as data representing graphical models to be displayed to a user. Memory 150 may store intermediate data. System 130 may include cache memory which may include data duplicating original values stored elsewhere or computed earlier, where the original data may be relatively more expensive to fetch (e.g., due to longer access time) or to compute, compared to the cost of reading the cache memory. Cache memory may include pages, memory lines, or other suitable structures. Additional or other suitable memory may be used.

Computing system 130 may include a computing module having machine-executable instructions. The instructions may include, for example, a data processing mechanism (including, for example, embodiments of methods described herein) and a modeling mechanism. These instructions may be used to cause processor 140 using associated software 160 modules programmed with the instructions to perform the operations described. For example, processor 140 may be configured to (e.g., by being connected to or associated with a memory storing software) carry out methods as described herein. Alternatively, the operations may be performed by specific hardware that may contain hardwired logic for performing the operations, or by any combination of programmed computer components and custom hardware components.

Embodiments of the invention may include an article such as a non-transitory computer or processor readable medium, or a non-transitory computer or processor storage medium, such as for example a memory, a disk drive, or a USB flash memory, encoding, including or storing instructions, e.g., computer-executable instructions, which when executed by a processor or controller, carry out methods disclosed herein.

Processor 130 may perform various methods described herein. For example, processor 140 may generate a geological time function t(x,y,z) according to techniques known in the art. The geological time function t(x,y,z) may be an arbitrary monotonic increasing function of the actual geological-time.

Processor 140 may generate local axis a(x,y,z) and co-axis b(x,y,z), which characterize the geometry of horizon $H(t_0)$ in G-space, which models the current state of subsurface structures. Processor 140 may generate paleo-geographic coordinates u(x,y,z) and v(x,y,z) and geological-time t(x,y,z) defining a horizon $H^*(t_0)$ in G*-space, which models a "past" state of the subsurface structures at a time when they were originally deposited. The paleo-geographic coordinates of the past depositional model relate to the geometry of the current modeled horizons, e.g., defined by the local axis a(x,y,z) and co-axis b(x,y,z) of the current modeled horizons.

Processor 140 may generate functions {u(x,y,z), v(x,y,z), t(x,y,z)} between G-space and G*-space to transform a current model in G-space of a discontinuous faulted horizon to a single substantially continuous horizon in G*-space. The paleo-geographic coordinates {u(x,y,z), v(x,y,z)} may be defined by a system of equations (e.g., equations [11a], [11b] or [12a], [12b]) which are linear and independent from each other. Processor 140 may solve equations [11a], [11b] or [12a], [12b] to generate paleo-geographic coordinates to model a horizon H*($t_0$) in G*-space.

Display 180 may display data from transmitter 190, receiver 120, or computing system 130 or any other suitable systems, devices, or programs, for example, an imaging program or a transmitter or receiver tracking device. Display 180 may include one or more inputs or outputs for displaying data from multiple data sources or to multiple displays. For example display 180 may display visualizations of subsurface models including subsurface features, such as faults, horizons and unconformities. Display may display horizon H($t_0$) in G-space and or horizon H*($t_0$) in G*-space. For example, the models may be displayed separately, adjacent to, or overlapping each other, for example, so that a user may inspect similarities to determine points in horizon H($t_0$) in G-space that cause gaps or overlapping surfaces of the horizon H*($t_0$) in G*-space. Display 180 may display the models in separate pages or windows and a user may select one of the models (e.g., by clicking a 'G-space' or 'G*-space' button with a pointing device such as a mouse or by scrolling between the models). In one embodiment, a local axis and/or a local co-axis vector field characterizing the local curvature of a model may be displayed adjacent to or overlapping the model in G-space. For example, in addition to each point of the display, vectors indicating the direction of the axis and/or co-axis may also be displayed. A user may select a display option to temporarily hide the vectors. A color or symbol may be displayed to differentiate the axis and co-axis vectors.

In one embodiment, the user may highlight, draw or mark a model on display 180. For example, a user may draw a segment onto horizon H*($t_0$) of the G*-space model so the segment intersects a "pathological" border of a gap or overlap on the horizon. For example, a user may operate input device 165 (e.g., a mouse) to control a cursor on the graphical user interface to draw a segment onto the graphic display of horizon H*($t_0$). Processor 140 may identify (e.g., using the reverse uvt-transformation), remove and/or correct pathological points in the horizon H($t_0$) of the G-space model associated with the gap or overlap of horizon H*($t_0$) of the G*-space through which the segment is drawn. For example, the pathological points may be marked, flagged, or highlighted on the horizon H($t_0$) as displayed to a user. Corresponding colored marks in the G-space and G* space models may be used to indicate which points in the G-space model cause or are associated with the gaps or overlaps in the G* space model. Additionally, automatically or in response to a command from the user, processor 140 may regenerate horizon H*($t_0$) of the G*-space without the gap or overlap and/or horizon H($t_0$) of the G-space without the pathological pair of points ($f_-$, $f_+$) associated with the gap or overlap. In another embodiment, a user may identify by inspection pathological points on the horizon H($t_0$) of the G-space model associated with the gap or overlap of horizon H*($t_0$) of the G*-space through which the segment is drawn. The user may identify these points solely by inspection, or by accepting or refusing points, which were identified by processor 140.

Input device(s) 165 may include a keyboard, pointing device (e.g., mouse, trackball, pen, touch screen), or cursor direction keys, communicating information and command selections to processor 140. Input device 165 may communicate user direction information and command selections to the processor 140. For example, a user may use input device 165 to select and correct one or more gaps or overlaps in a model (e.g., by pointing a 'select', 'correct' or 'delete' button on a display 180 monitor adjacent to the model using a cursor controlled by a mouse or by drawing a line intersecting the gaps or overlaps or by highlighting the pathological region and pressing the correct key on the graphical user interface).

Processor 140 may include, for example, one or more processors, controllers, central processing units ("CPUs"), or graphical processing units ("GPUs"). Software 160 may be stored, for example, in memory 150. Software 160 may include any suitable software, for example, DSI software.

Processor 140 may generate corresponding models in G-space and G* space, for example, using data 155 from memory 150. In one embodiment, a model may simulate structural, spatial or geological properties of a subsurface region, such as, porosity or permeability throughout geological terrains.

Processor 140 may initially generate a three dimensional mesh, lattice, or collection of nodes that spans or covers a domain of interest. The domain may cover a portion or entirety of the three-dimensional studied domain sought to be modeled. Processor 140 may automatically compute the domain to be modeled and the corresponding mesh based on the collected seismic data so that the mesh covers a portion or the entirety of the three-dimensional space from which seismic data is collected (e.g., the studied subsurface region). Alternatively or additionally, the domain or mesh may be selected or modified by a user, for example, entering coordinates or highlighting regions of a simulated optional domain or mesh. For example, the user may select a domain or mesh to model a region of the Earth that is greater than a user-selected subsurface distance (e.g., 100 meters) below the Earth's surface, a domain that occurs relative to geological features (e.g., to one side of a known fault or riverbed), or a domain that occurs relative to modeled structures (e.g., between modeled horizons H($t_1$) and H($t_{100}$)). Processor 140 may execute software 160 to partition the mesh or domain into a plurality of three-dimensional (3D) cells, columns, or other modeled data (e.g., represented by voxels, pixels, data points, bits and bytes, computer code or functions stored in memory 150). The cells or voxels may have hexahedral, tetrahedral, or any other polygonal shapes, and preferably three-dimensional shapes. Alternatively, data may include zero-dimensional nodes, one-dimensional segments, two-dimensional facets and three-dimensional elements of volume, staggered in a three-dimensional space to form three-dimensional data structures, such as cells, columns or voxels. The cells may preferably conform to and approximate the orientation of faults and unconformities. Each cell may include faces, edges and/or vertices. Each cell or node may correspond to or represent one or more particles of a subsurface material in the Earth (e.g., a cell may include many cubic meters of particles). Each cell, face, edge, vertex or node may be located, e.g., in a grid or lattice, throughout the model. In contrast, a point of the model may be located at any location in the modeled domain, for example, in a cell between adjacent nodes. As shown in FIG. 1, model 110 in G*-space 106, e.g., modeling geological data at depositional geological time (the time the structures being modeled were originally deposited) may be generated using a regular mesh (e.g., having a uniform lattice or grid structure or nodes and cells). In contrast, model 108 of FIG. 1 may be generated using an irregular mesh (having an irregular lattice or arrangement or nodes or cells). Again in reference to FIG. 6, data collected by receiver 120 after the time of deposition in a current or present time period, faults and unconformities that have developed since the original time of deposition, e.g., based on tectonic motion, erosion, or other environmental factors, may disrupt the regular structure of the geological domain. Accordingly, an irregular mesh may be used to model current geological structures, for example, so that at least some faces, edges, or surfaces of cells may be oriented parallel to faults or unconformities, and may not be intersected thereby. In one embodiment, a mesh may be generated based on data collected by receiver 120, alternatively, a generic mesh may be generated to span the domain and the data collected by receiver 120 may be used to modify the structure thereof. For example, the data collected may be used to generate a set of point values at "sampling point." The values at these points may reorient the nodes or cells of the mesh to generate a model that spatially or otherwise represents the geological data collected from the Earth. Other or different structures, data points, or sequences of steps may be used to process collected geological data to generate a model. The various processes described herein (e.g., generating models) may be performed by manipulating such modeling data.

The geological-time function $t(x,y,z)$ and the paleo-geographic coordinates $u(x,y,z)$ and $v(x,y,z)$ may be defined at a finite number of nodes or sampling points based on real data corresponding to a subsurface structure, e.g., one or more particles or a volume of particles of Earth. These functions may be approximated between nodes to continuously represent the subsurface structure, or alternatively, depending on the resolution in which the data is modeled may represent discrete or periodic subsurface structures, e.g., particles or volumes of Earth that are spaced from each other.

In one embodiment, input data to computing system 130 may include horizon sampling points, including well paths, well markers, or other data. Sampling points may be displayed on the horizon model. Data removed from the set of sampling points (e.g., a pathological set of sampling points in G*-space forming overlaps or gaps in the model in G-space) may be displayed on the model with the retained sampling points, e.g., in a different color or by a symbol having a different geometrical shape.

Fault surfaces, horizon surfaces, model boundaries (e.g., as lines or transparent surfaces) may be modeled and displayed on display 180. The paleo-geographic coordinate functions u and v of the uvt-transform may be "painted" on horizons as a grid (e.g., each line of the grid may correspond to a constant value for function u or the function v). The model may be displayed, for example in geological space or in geo-chronological space or both at the same time. A global geological axis, local axis and co-axis vector fields may be displayed overlaying or adjacent to the model, e.g., represented by symbols such as arrows. Arrows representing the local axis vector field may be distinguished from arrows representing the local co-axis vector field for example by displaying the respective arrows using different colors.

One embodiment of the invention distinguishes over what is known in the art by transforming a current model (in G-space) to a depositional model (in G*-space), where the transformation is defined by equations depending on the geometry of the current model (e.g., the local curvature of a modeled horizon). Accordingly, since the geometry of different models may vary, the equations defined by such geometry that transform a current model to a depositional model may also vary. That is, a plurality of current models having different geometries (e.g., curvature or shape characterized by local axis and/or co-axis vectors) may be transformed to a depositional model by different sets of equations, each individualized to correspond to the geometry of the model being transformed, allowing the basic physical principles outlined in equations [3a-e] or [4a-c] to be honored exactly. In contrast, known methods in the art do not take into account the local geometric information represented by the axis and co-axis and transform all current models to depositional models using the same set of equations $[3c_1, 3d, 3e]$ or $[4c_1\text{-}c_2]$. These equations are approximations of equations [3a-e] or [4a-c], respectively, and do not ensure all aspects of basic physical principles, e.g., minimum deformation principles, are honored by the $u(x,y,z)$ and $v(x,y,z)$ transformation thus computed.

Figure 7:
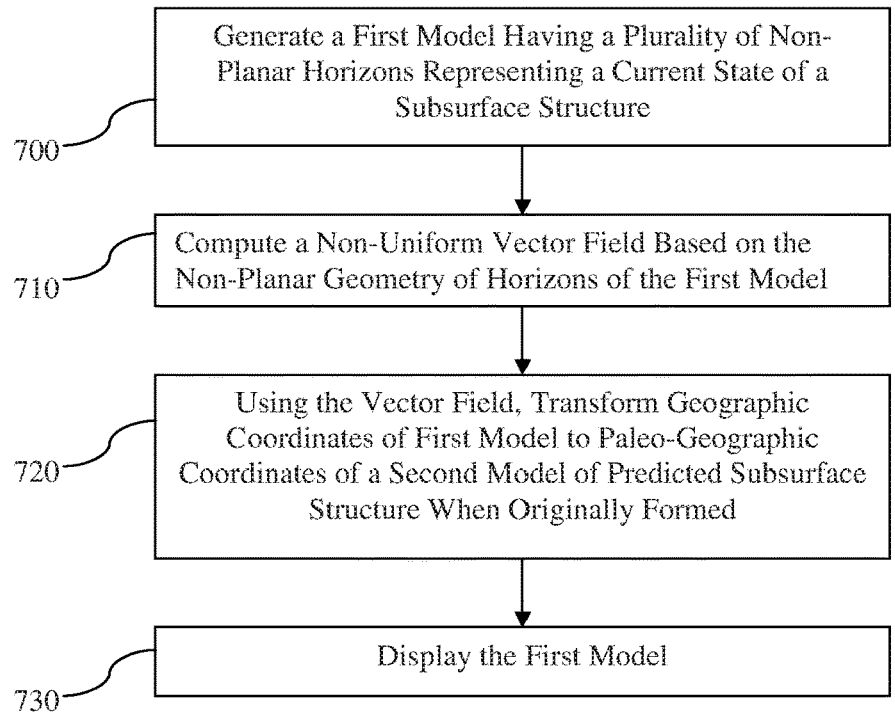
FIGS. 7-10 are flowcharts of methods according to embodiments of the invention.

Reference is made to FIG. 7, which is a flowchart of a method for modeling a subsurface structure at a time period when the structure was originally formed, which may be performed for example using system 105 of FIG. 6, or other suitable systems. Other operations or series of operations may be used, and the exact set of steps shown below may be varied.

In operation 700, a computing device (e.g. processor 140 of FIG. 6) may generate a first model having a plurality of non-planar horizons representing a current state of the subsurface structure.

In operation 710, the computing device may compute a non-uniform vector field based on the non-planar geometry of the horizons of the first model. The geometry of the horizons may be a measure of for example a direction of curvature along each horizon. The geometry of the horizons may be defined by a main or global structural axis associated with the horizons and/or a local axis and co-axis along the horizons. A vector field representing the geometry of the horizons may be stored in a computer memory or other storage device (e.g. memory 150 of FIG. 6). The horizons and the corresponding vector field generated based on the geometry of the horizons may be displayed, e.g., in adjacent, overlapping or separate displays.

A vector field may be generated based on the shape, curvature or other geometric properties of a current geological model. Accordingly, the transformation from a current model to a past depositional model, which uses the vector field as an input parameter, may also be based on the geometry of the current model. For example, if a current horizon has a relatively steep or large curvature, the transformation necessary to flatten the curved horizon in the past depositional space will be greater than if the curvature of the horizon had been less steep. In one example, the local axis and co-axis vectors may represent approximations of the directions of local curvature of surface horizons in a geological domain. These vectors may be used to generate the paleo-geographic coordinates, which at least in part define the uvt-transformation. In contrast, old systems use equations [3a-e] and [4a-c] to model horizons, which do not use information related to the local axis and local co-axis or geometry of the horizons themselves.

In operation 720, using the vector field, the computing device may transform geographic coordinates of the first model to paleo-geographic coordinates of a second model representing a predicted state of the subsurface structure at a time period when the subsurface structure was originally formed. The non-planar horizons in the first model may be transformed to planar horizons in the second model. The horizons of the second model may be generated using a transformation of the horizons of the first model. The transformation may be defined by a plurality of equations that are linear and independent from each other. In one embodiment, two sides of a discontinuous non-planar horizon of the first model fractured by a fault may be transformed to a single substantially continuous planar horizon in the second model, for example, using a uvt-transform (e.g., uvt-transform 100 of FIG. 1).

In operation 730, a display device (e.g. display 180 of FIG. 6) may display the first model and/or the second model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 8:
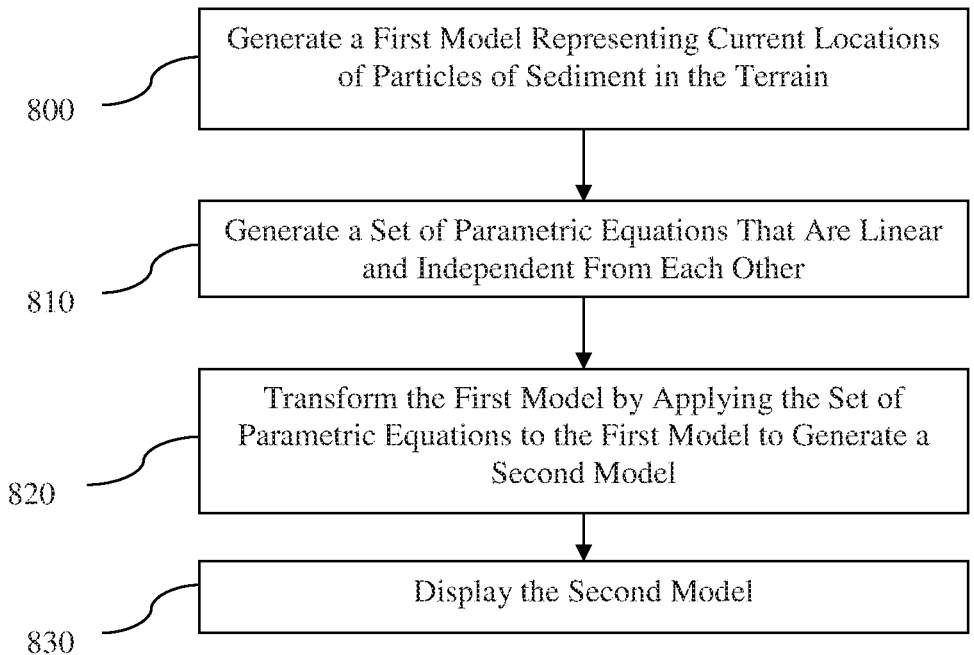

Reference is made to FIG. 8, which is a flowchart of a method for transforming subsurface models modeling a terrain, which may be performed for example using system 105 of FIG. 6, or other suitable systems. Other operations or series of operations may be used, and the exact set of steps shown below may be varied.

In operation 800, a computing device (e.g. processor 140 of FIG. 6) may generate a first model representing current locations of particles of sediment in the terrain.

In operation 810, the computing device may generate a set of equations that are linear and independent from each other. A computer memory (e.g. memory 150 of FIG. 6) may store the set of equations.

In operation 820, the computing device may transform the first model by applying the set of equations to the first model to generate a second model. The second model may represent past locations of the particles of sediment at a time when the particles were originally deposited in the Earth. The transformation may correspond to one of a plurality of possible deformations from the past locations of the particles of sediment to their current locations. The one of a plurality of possible deformations to which the transformation corresponds may use a minimal amount of energy as compared to the remaining deformations in the plurality of deformations. The one of a plurality of possible deformations to which the transformation corresponds may be defined by for example a strain tensor having components that are approximately zero.

In operation 830, a display device (e.g. display 180 of FIG. 6) may display the second model. Optionally, the display device may display the first model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 9:
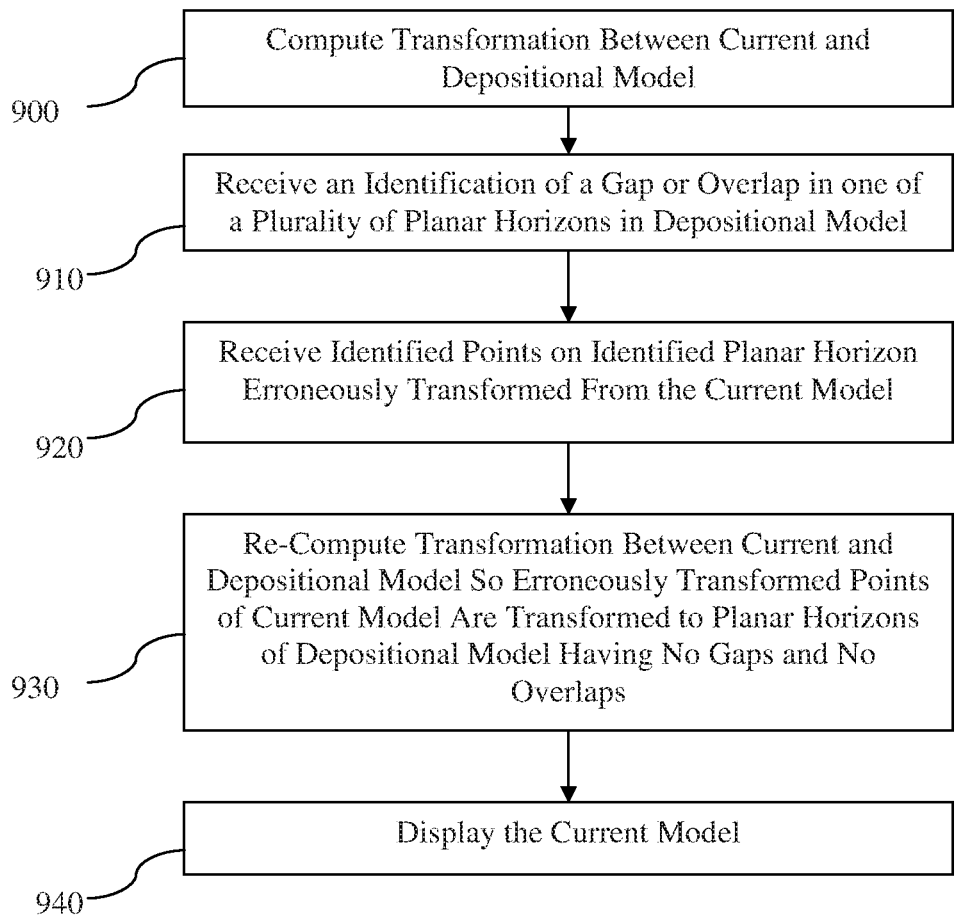

Reference is made to FIG. 9, which is a flowchart of a method for editing models of a geological structure, which may be performed for example using system 105 of FIG. 6, or other suitable systems. Other operations or series of operations may be used, and the exact set of steps shown below may be varied.

In operation 900, a computing device (e.g. processor 140 of FIG. 6) may compute a transformation between a current model having geographic coordinates representing an observed geological structure and a depositional model having paleo-geographic coordinates representing a calculated or predicted state of the geological structure at a time period when the structure was originally formed. The transformation may include a set of equations, e.g., which are linear and independent from each other.

In operation 910, the computing device may receive an identification of a gap or an overlap in one of a plurality of planar horizons in the depositional model. The depositional model may represent locations of particles of sediment at a time when the particles were originally deposited in the Earth. Each horizon may be determined to be deposited at a substantially different geological time. The gap or overlap may be identified by a user drawing a segment on the initial model that intersects the gap or overlap of the model.

In operation 920, the computing device may receive identified points on the planar horizon of the depositional model having the identified gap or overlap, where the identified points are erroneously transformed (e.g., or calculated or predicted to be erroneously transformed) from the corresponding points of the current model. The current model may represent approximate current locations of particles of sediment in the terrain. The identified points in the deformed model may be received after being generated automatically by a computing device applying the transformation to the corresponding gap or overlap in the depositional model.

In operation 930, the computing device may re-compute the transformation between the current and depositional models so that points of the current model which were erroneously transformed to the identified points, are transformed to a planar horizon of the depositional model having no gaps and no overlaps.

In operation 940, a display device (e.g. display 180 of FIG. 6) may display the current model. Optionally, the display device may display the depositional model. The current model and depositional model may be displayed on the same monitor or on two or more separate monitors.

Figure 10:
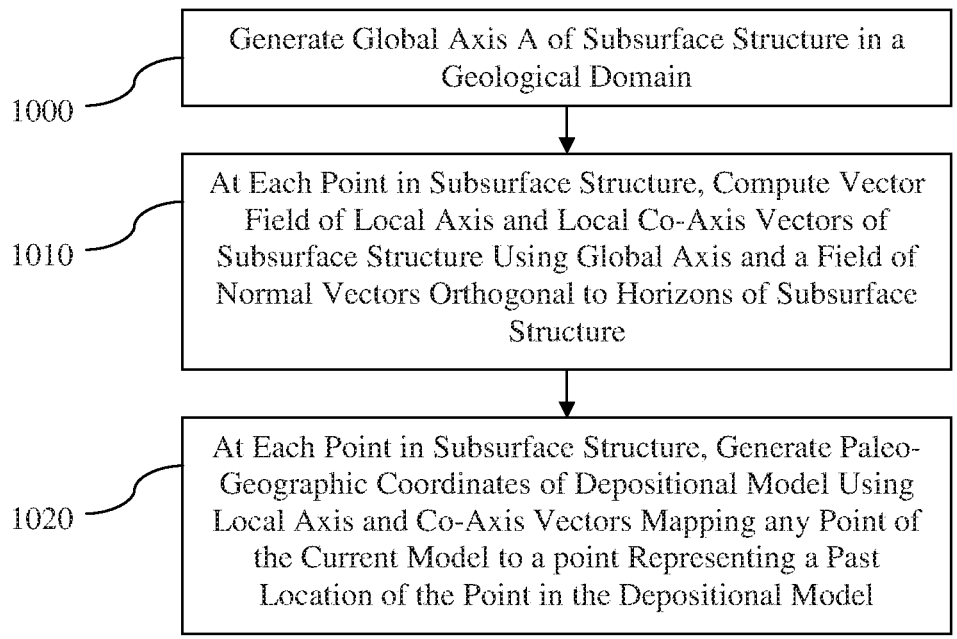

Reference is made to FIG. 10, which is a flowchart of a method for generating a depositional model representing the calculated or predicted past geometry of a subsurface structure in a current model using a global axis and local axis and local co-axis of the structure in the current model, which may be performed for example using system 105 of FIG. 6, or other suitable systems. Other operations or series of operations may be used, and the exact set of steps shown below may be varied.

In operation 1000, a computing device (e.g. processor 140 of FIG. 6) may generate a global axis A of the subsurface structure in a geological domain.

In operation 1010, at each point (x,y,z) in the subsurface structure, the computing device may compute a vector field of local axis a(x,y,z) and local co-axis b(x,y,z) vectors of the subsurface structure using the global axis A and a field of normal vectors orthogonal to horizons of the subsurface structure in the geological domain.

In operation 1020, at each point (x,y,z) in the subsurface structure, the computing device may generate paleo-geographic coordinates u(x,y,z) and v(x,y,z) of the depositional model using the local axis a(x,y,z) and co-axis b(x,y,z) vectors. The paleo-geographic functions u(x,y,z) and v(x,y,z) may map any point (x,y,z) of the current model to a point (u(x,y,z), v(x,y,z), t(x,y,z)) representing a past location of the point in the depositional model.

The computing device may compute the global axis A of the subsurface structure to be an eigen vector associated with the smallest eigen value of a matrix [m] generated using the field of normal vectors, for example, orthogonal to the horizons. The computing device may receive user input selecting the global axis A. The computing device may generate the paleo-geographic coordinates u(x,y,z) and v(x, y,z) assuming that deformation of the subsurface structure deformed from the past depositional model to the current model was minimal.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 12:
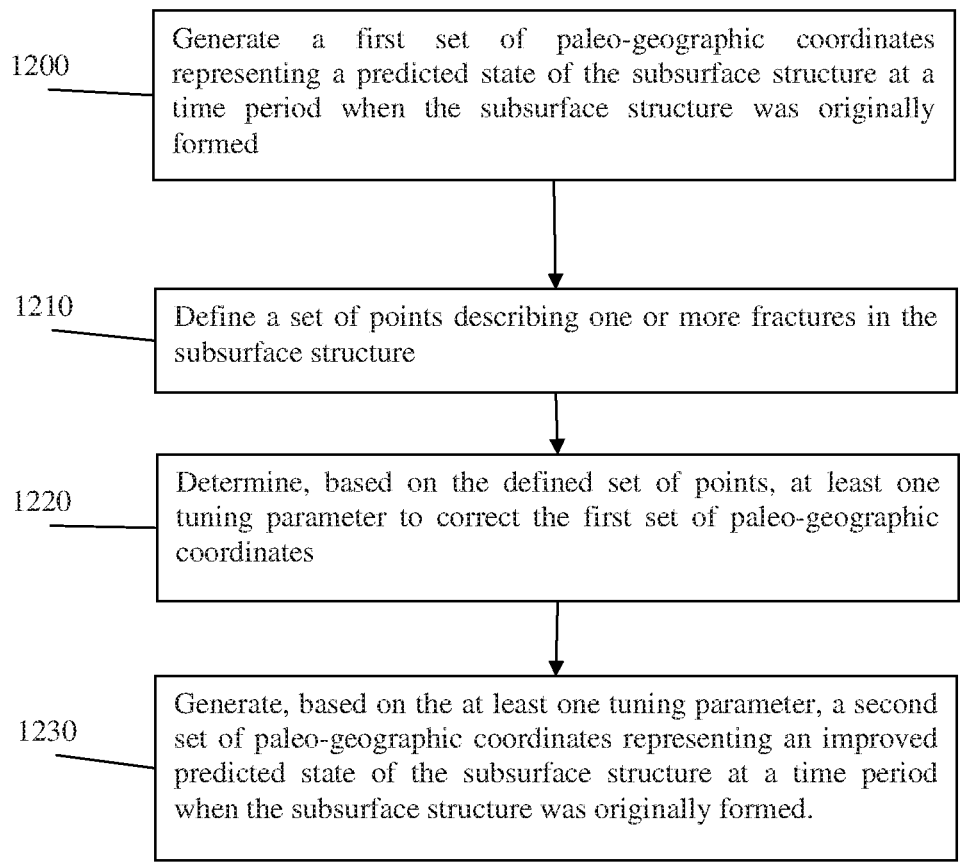
FIG. 12 is a flowchart of a method according to embodiments of the invention.

Reference is made to FIG. 12, which is a flowchart of a method for optimizing paleo-geographic coordinates, which may be performed for example using system 105 of FIG. 6, or other suitable systems. Other operations or series of operations may be used, and the exact set of steps shown below may be varied.

In operation 1200, a computing device (e.g. processor 140 of FIG. 6) may generate a first set of paleo-geographic coordinates representing an estimated, calculated or predicted state of the subsurface structure at a time period when the subsurface structure was originally formed. The first set of paleo-geographic coordinates may be transformed from geographic coordinates of a model representing a current state of the subsurface structure. The transformation may include a set of equations, e.g., which are linear and independent from each other. The model may include a plurality of non-planar horizons, and the computing device may compute a non-uniform vector field based on the non-planar geometry of the model's non-planar horizons.

In operation 1210, the computing device may define a set of points describing one or more fractures in the subsurface structure. The fractures or families of fractures may be observed in the current substructure. A computer memory (e.g. memory 150 of FIG. 6) may store the set of points or families of fractures in a horizon.

In operation 1220, the computing device may determine, based on the defined set of points, at least one tuning parameter to correct the first set of paleo-geographic coordinates. The tuning parameter(s) may allow a model of the direction of potential fracture e.g., defined by a strain tensor, to more closely match the observed fractures. The potential fracture model or strain tensor may describe the relationship between the first set of paleo-geographic coordinates and the model representing a current state of the subsurface structure. For each of the points describing the fractures or family of fractures, the computing device may determine a tuning value which minimizes the discrepancy between the estimated direction of potential fracture and the observed direction of fracture at the point of fracture. The tuning parameters may be determined from the mean or median of all the determined tuning values. The tuning parameters may, alternatively, be functions of geographic coordinates.

In operation 1230, the computing device may generate, based on the at least one tuning parameter, a second set of paleo-geographic coordinates representing an improved (e.g., more accurate) calculated or predicted state of the subsurface structure at a time period when the subsurface structure was originally formed. The second set of paleo-geographic coordinates may be transformed from the first set of paleo-geographic coordinates according to a Galilean or shearing transformation, or other type of transformation. The tuning parameters may be used in the transformation, which may correct, offset, or improve the accuracy of the first set of paleo-geographic coordinates. Based on this, a display, e.g., display 180, may display a visualization of the corrected, offset, or improved paleo-geographic coordinates.

Other operations of series of operations may be used.

In the foregoing description, various aspects of the present invention have been described. For purposes of explanation, specific configurations and details have been set forth in order to provide a thorough understanding of the present invention. However, it will also be apparent to one skilled in the art that the present invention may be practiced without the specific details presented herein. Furthermore, well known features may have been omitted or simplified in order not to obscure the present invention. Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

Embodiments of the invention may manipulate data representations of real-world objects and entities such as underground geological features, including faults, horizons and other features. Data received by for example a receiver receiving waves generated by an air gun or explosives may be manipulated and stored, e.g., in memory 150, and data such as images representing underground features may be presented to a user, e.g., as a visualization on display 180.

When used herein, a map or transformation takes one or more points (x,y,z) defined in a first domain and applies a function, f, to each point to generate a new one or more points f(x,y,z). Accordingly mapping or transforming a first set of horizons or other geological structures may generate new structures according to the change defined by the transformation function or map.

When used herein, geological features such as horizons and faults may refer to the actual geological feature existing in the real world, or computer data representing such features (e.g., stored in a memory or mass storage device). Some features when represented in a computing device may be approximations or estimates of a real world feature, or a virtual or idealized feature, such as an idealized horizon as produced in a uvt-transform. A model, or a model representing subsurface features or the location of those features, is typically an estimate or a "model", which may approximate or estimate the physical subsurface structure being modeled with more or less accuracy.

It should be recognized that embodiments of the present invention may solve one or more of the objectives and/or challenges described in the background, and that embodiments of the invention need not meet every one of the above objectives and/or challenges to come within the scope of the present invention. While certain features of the invention have been particularly illustrated and described herein, many modifications, substitutions, changes, and equivalents may occur to those of ordinary skill in the art. It is, therefore, to be understood that the appended claims are intended to cover all such modifications and changes in form and details as fall within the true spirit of the invention.

What is claimed is:

1. A method for generating a depositional model representing a predicted past geometry of a subsurface structure using a global axis, local axis, and local co-axis, of the subsurface structure in a region of a present day geological domain, the method comprising:

generating a global axis of the subsurface structure in the region of the present day geological domain;

at each point of the subsurface structure in the region of the present day geological domain, computing a vector field of local axis and local co-axis vectors characterizing the approximate local directions of curvature of the subsurface structure using the global axis and a field of normal vectors orthogonal to horizons of the subsurface structure in the region of the present day geological domain;

at each point of the subsurface structure in the region of the present day geological domain, generating paleo-geographic coordinates of the depositional model based on the geometry of the present day configuration of the subsurface structure using the local axis and co-axis vectors, wherein the paleo-geographic coordinates map each point in the region of the present day geological domain to a point in the depositional model representing a predicted past location of one or more particles of sediment when the particles were originally deposited; and displaying the depositional model using the paled-geographic coordinates visualizing the predicted past geometry of the subsurface structure.

2. The method of claim 1 comprising computing the global axis of the subsurface structure to be an eigen vector associated with the smallest eigen value of a matrix generated using the field of normal vectors orthogonal to the horizons.

3. The method of claim 1 comprising receiving user input selecting the global axis.

4. The method of claim 1, wherein the patio-geographic coordinates are generated assuming that the subsurface structure had minimal deformation from the past depositional model to the present day geological domain.

5. The method of claim 1, wherein the patio-geographic coordinates are generated by modeling the deformation of the subsurface structure from the past depositional model to the present day geological domain using infinitely thin modeled layers that slide against each other.

6. The method of claim 1 comprising generating the horizons of the subsurface structure in the present day geological domain using one or more of seismic records and well data collected by probing the subsurface structure.

7. The method of claim 1 comprising representing the depositional model by a geological time t and paleo-geographic coordinates u and v.

8. The method of claim 1 comprising representing the present day geological domain by Cartesian (x,y,z) coordinates.

9. The method of claim 1, wherein the paleo-geographic coordinates are generated using a set of equations that are linear and independent from each other.

10. The method of claim 1 comprising:
receiving an identification of a gap or an overlap in a planar horizon in the depositional model;
receiving identified points on the planar horizon, wherein the identified points are erroneously generated based on corresponding points of the present day geological domain; and
re-generating the paleo-geographic coordinates of the depositional model so that points of the present day geological domain corresponding to the identified points, generate points on a planar horizon in the depositional model having no gaps and no overlaps.

11. The method of claim 1 comprising receiving geological data representing the present day configuration of the subsurface structure in the region of a present day geological domain, wherein the geological data is seismic data produced in a three-dimensional field by a transmitter emitting seismic waves that reflect at geological discontinuities throughout the subsurface structure and a receiver receiving the reflected seismic waves that correspond to the seismic waves output by the transmitter.

12. A system configured to generate a depositional model representing a predicted past geometry of a subsurface structure using a global axis, local axis, and local co-axis, of the subsurface structure in a region of a present day geological domain, the system comprising:

a memory to store data representing the subsurface structure in the region of the present day geological domain;
a processor configured to:
generate a global axis of the subsurface structure in the region of the present day geological domain,
at each point of the subsurface structure in the region of the present day geological domain, compute a vector field of local axis and local co-axis vectors characterizing the approximate local directions of curvature of the subsurface structure using the global axis and a field of normal vectors orthogonal to horizons of the subsurface structure in the region of the present day geological domain, and
at each point of the subsurface structure in the region of the present day geological domain, generate paled-geographic coordinates of the depositional model based on the geometry of the present day configuration of the subsurface structure using the local axis and co-axis vectors, wherein the paleo-geographic coordinates map each point in the region of the present day geological domain to a point in the depositional model representing a predicted past location of one or more particles of sediment when the particles were originally deposited; and
a display to display the depositional model using the paled-geographic coordinates to visualize the predicted past geometry of the subsurface structure.

13. The system of claim 12, wherein the processor is configured to compute the global axis of the subsurface structure to be an eigen vector associated with the smallest eigen value of a matrix generated using the field of normal vectors orthogonal to the horizons.

14. The system of claim 12, wherein the processor is configured to receive user input selecting the global axis.

15. The system of claim 12, wherein the processor is configured to generate the paled-geographic coordinates assuming that the subsurface structure had minimal deformation from the past depositional model to the present day geological domain.

16. The system of claim 12, wherein the processor is configured to generate the paler-geographic coordinates by modeling the deformation of the subsurface structure from the past depositional model to the present day geological domain using infinitely thin modeled layers that slide against each other.

17. The system of claim 12, wherein the processor is configured to generate the horizons of the subsurface structure in the present day geological domain using one or more of seismic records and well data collected by probing the subsurface structure.

18. The system of claim 12, wherein the processor is configured to represent the depositional model by a geological time t and paled-geographic coordinates u and v.

19. The system of claim 12, wherein the processor is configured to represent the present day geological domain by Cartesian (x,y,z) coordinates.

20. The system of claim 12, wherein the processor is configured to generate the paleo-geographic coordinates using a set of equations that are linear and independent from each other.

21. The system of claim 12, wherein the processor is configured to:
- receive an identification of a gap or an overlap in a planar horizon in the depositional model,
- receive identified points on the planar horizon, wherein the identified points are erroneously generated based on corresponding points of the present day geological domain, and
- re-generate the paleo-geographic coordinates of the depositional model so that points of the present day geological domain corresponding to the identified points, generate points on a planar horizon in the depositional model having no gaps and no overlaps.

* * * * *